United States Patent
Kato

(10) Patent No.: US 9,852,241 B2
(45) Date of Patent: Dec. 26, 2017

(54) HIGHLY ACCURATE CORRELATING METHOD FOR PHASE EQUILIBRIUM DATA, AND PHASE EQUILIBRIUM CALCULATION METHOD

(71) Applicant: TOKYO METROPOLITAN UNIVERSITY, Tokyo (JP)

(72) Inventor: Satoru Kato, Tokyo (JP)

(73) Assignee: TOKYO METROPOLITAN UNIVERSITY, Tokyo (JP)

( * ) Notice: Subject to any disclaimer, the term of this patent is extended or adjusted under 35 U.S.C. 154(b) by 855 days.

(21) Appl. No.: 14/348,439

(22) PCT Filed: Sep. 25, 2012

(86) PCT No.: PCT/JP2012/074514
§ 371 (c)(1),
(2) Date: Mar. 28, 2014

(87) PCT Pub. No.: WO2013/047494
PCT Pub. Date: Apr. 4, 2013

(65) Prior Publication Data
US 2014/0288905 A1   Sep. 25, 2014

(30) Foreign Application Priority Data

Sep. 29, 2011   (JP) ................................. 2011-215133

(51) Int. Cl.
*G06F 17/10*       (2006.01)
*G06F 17/50*       (2006.01)
(Continued)

(52) U.S. Cl.
CPC ........... *G06F 17/5009* (2013.01); *B01D 3/32* (2013.01); *B01D 3/42* (2013.01); *B01D 9/0063* (2013.01); *B01D 11/0484* (2013.01)

(58) Field of Classification Search
CPC ... G06F 17/5009; B01D 11/0484; B01D 3/32; B01D 3/42; B01D 9/0063
(Continued)

(56) References Cited

U.S. PATENT DOCUMENTS 5,343,407 A    8/1994  Beauford et al.
5,874,657 A *  2/1999  Miller ................... C07C 17/386
                                                    570/178

(Continued)

FOREIGN PATENT DOCUMENTS

GB        1362825        8/1974

OTHER PUBLICATIONS

Extended European Search Report dated Jan. 25, 2016 in corresponding European Patent Application No. 12836019.5.
(Continued)

*Primary Examiner* — Andre Pierre Louis

(57) ABSTRACT

A method for precisely predicting phase equilibrium from existing phase equilibrium data on the basis of a wide range of phase equilibrium data including binary vapor-liquid equilibrium data; a method or apparatus for designing or controlling a component separator or a refiner using the prediction method; and a program for designing this design or control apparatus. Binary phase equilibrium measurement data is used to calculate an index of proximity ratio to critical points and infinite dilution pressure gradients. The obtained index is correlated with the infinite dilution pressure gradients to newly calculate infinite dilution activity coefficients from the respective index to infinite dilution pressure gradients correlations. The obtained infinite dilution activity coefficients values are used to predict phase equilibrium. Thus, the obtained values are used to design or control a component separator or a refiner, such as a distillation column.

4 Claims, 24 Drawing Sheets

(51) Int. Cl.
*B01D 3/32* (2006.01)
*B01D 3/42* (2006.01)
*B01D 9/00* (2006.01)
*B01D 11/04* (2006.01)

(58) Field of Classification Search
USPC .......................................................... 703/2
See application file for complete search history.

(56) References Cited

U.S. PATENT DOCUMENTS 7,941,277 B2 * 5/2011 Chen ................. G01N 30/8693
702/19
2007/0131535 A1 * 6/2007 Shiflett .................... B01D 3/14
203/50

OTHER PUBLICATIONS

"Distillation", Kirk-Othmer Encyclopedia of Chemical Technology. John Wiley & Sons, Inc., vol. 8, Aug. 17, 2001, pp. 739-785.
"Software and Services in Process Simulation", ProSim, Apr. 27, 2010, retrieved from the Internet, 2 pp.
Shing, "Infinite-Dilution Activity Coefficients From Computer Simulation", Chemical Physics Letters, vol. 119, No. 2,3, Aug. 30, 1985, pp. 149-151.
K. Wohl, "Thermodynamic Evaluation of Binary and Ternary Liquid Systems," *Trans. Am. Inst. Chem. Eng.*, vol. 42, 1946, pp. 215-249.
J. Gmehling et al., "Vapor-Liquid Equilibrium Data Collection," *DECHEMA Chemistry Data Series*, vol. I, Part 1-8a, 1977.
J.M. Sorensen et al., "Liquid-Liquid Equilibrium Data Collection, Binary Systems," *DECHEMA Chemistry Data Series*, vol. V, Part 1, 1979.
H. Knapp et al., "Vapor-Liquid Equilibria for Mixtures of Low Boiling Substances," *DECHEMA Chemistry Data Series*, vol. VI, 1982.
R.C. Reid et al., *The Properties of Gases and Liquids*, New York, McGraw-Hill, 1987.
K. Kojima et al., "Measuring Methods of Infinite Dilution Activity Coefficients and a Data base for Systems Including Water," *Fluid Phase Equilibria*, vol. 131, 1997, pp. 145-179.
S. Kato et al., "Thermodynamic Consistency Lines of the 511 Mutual Solubility Data and the VLE Data of 7262 Constant-Temperature and 5167 Constant-Pressure Binaries," *Solvent Extraction Research and Development*, Japan, vol. 18, 2011, 85-92.
S. Kato, "An empirical consistency test using thermodynamic consistency lines for the VLE data of 7262 constant-temperature and 5167 constant-pressure binaries," *Fluid Phase Equilibria*, vol. 302, 2011, pp. 202-212.
International Search Report dated Jan. 8, 2013 in corresponding International Patent Application No. PCT/JP2012/074514.

* cited by examiner

Related Art

FIG. 17

| No. | Part | Page | Constant Temperature /Pressure | P, T | Unit | A | B |
|---|---|---|---|---|---|---|---|
| 1 | 1 | 37 | P | 735 | mmHg | 1.2125 | 0.497 |
| 2 | 1 | 38 | T | 39.76 | °C | 0.4354 | 0.5222 |
| 3 | 1 | 39 | T | 49.76 | °C | 0.4502 | 0.5957 |
| 4 | 1 | 40 | P | 760 | mmHg | 0.8016 | 0.6361 |
| 5 | 1 | 41 | T | 60 | °C | 0.6916 | 0.5626 |
| 6 | 1 | 42 | T | 25 | °C | 0.4749 | 0.3378 |
| 7 | 1 | 43 | P | 760 | mmHg | 0.7933 | 1.125 |
| 8 | 1 | 44 | T | 25 | °C | 0.5548 | 0.5768 |
| 9 | 1 | 45 | T | 50 | °C | 0.6169 | 0.5848 |
| 10 | 1 | 46 | T | 62.5 | °C | 0.6271 | 0.5537 |
| 11 | 1 | 47 | P | 760 | mmHg | 0.7923 | 0.5434 |
| 12 | 1 | 48 | P | 760 | mmHg | 0.7661 | 0.5451 |
| 13 | 1 | 49 | T | 100 | °C | 0.8359 | 0.3786 |
| 16 | 1 | 52 | P | 760 | mmHg | 0.7607 | 0.5449 |
| 17 | 1 | 53 | P | 760 | mmHg | 0.8165 | 0.485 |
| 18 | 1 | 54 | P | 760 | mmHg | 0.8709 | 0.5278 |
| 19 | 1 | 55 | T | 35 | °C | 0.6904 | 0.4245 |
| 20 | 1 | 56 | T | 50 | °C | 0.6506 | 0.5204 |
| 21 | 1 | 57 | T | 65 | °C | 0.7292 | 0.5116 |
| 22 | 1 | 0 | P | 760 | mmHg | 0.7611 | 0.6207 |
| 23 | 1 | 60 | P | 760 | mmHg | 0.7279 | 0.6174 |
| 24 | 1 | 61 | P | 60 | mmHg | 0.392 | 0.2183 |
| 25 | 1 | 62 | P | 100 | mmHg | 0.5431 | 0.2737 |
| 26 | 1 | 63 | P | 200 | mmHg | 0.6547 | 0.4016 |
| 27 | 1 | 64 | P | 350 | mmHg | 0.731 | 0.4322 |
| 28 | 1 | 65 | P | 760 | mmHg | 0.7718 | 0.4545 |
| 29 | 1 | 66 | P | 200 | mmHg | 0.6939 | 0.3825 |
| 30 | 1 | 67 | P | 350 | mmHg | 0.7862 | 0.4607 |
| 31 | 1 | 68 | P | 500 | mmHg | 0.8158 | 0.4388 |
| 32 | 1 | 69 | P | 760 | mmHg | 0.8492 | 0.4956 |
| 33 | 1 | 70 | P | 760 | mmHg | 0.77 | 0.5304 |
| 34 | 1 | 71 | P | 760 | mmHg | 0.838 | 0.3032 |
| 35 | 1 | 72 | T | 39.9 | °C | 0.6875 | 0.4943 |
| 36 | 1 | 73 | T | 100 | °C | 0.8149 | 0.3937 |
| 37 | 1 | 74 | P | 760 | mmHg | 0.787 | 0.3858 |
| 38 | 1 | 75 | P | 760 | mmHg | 0.6458 | 0.5761 |
| 39 | 1 | 76 | P | 760 | mmHg | 0.761 | 0.5376 |
| 40 | 1 a | 49 | T | 25 | °C | 0.6304 | 0.4237 |
| 43 | 1 a | 52 | P | 760 | mmHg | 0.8664 | 0.4516 |
| 44 | 1 a | 53 | P | 760 | mmHg | 0.8517 | 0.4648 |
| 45 | 1 a | 54 | P | 760 | mmHg | 0.7782 | 0.5327 |
| 46 | 1 a | 55 | P | 760 | mmHg | 0.8325 | 0.3231 |
| 47 | 1 a | 57 | T | 60 | °C | 0.7803 | 0.5016 |
| 48 | 1 a | 58 | P | 760 | mmHg | 0.8164 | 0.4927 |
| 50 | 1 a | 61 | P | 760 | mmHg | 0.811 | 0.5167 |
| 51 | 1 b | 22 | P | 760 | mmHg | 0.7546 | 0.5824 |
| 52 | 1 b | 23 | P | 200 | mmHg | 0.7329 | 0.4184 |
| 53 | 1 b | 24 | P | 350 | mmHg | 0.7865 | 0.4402 |
| 54 | 1 b | 25 | P | 500 | mmHg | 0.8139 | 0.4492 |
| 55 | 1 b | 26 | P | 760 | mmHg | 0.8316 | 0.4742 |
| 58 | 1 b | 29 | T | 24.99 | °C | 0.5533 | 0.4339 |
| 59 | 1 b | 32 | T | 39.9 | °C | 0.463 | 0.635 |
| 60 | 1 b | 33 | T | 45 | °C | 0.6492 | 0.5144 |

FIG. 18

|    | Part | Page | Constant Temperature/Pressure | P, T   | Unit | A       | B       |
|----|------|------|-------------------------------|--------|------|---------|---------|
| 1  | 6 b  | 188  | T                             | 97.2   | °C   | 0.0367  | -0.0673 |
| 2  | 6 b  | 189  | T                             | 55     | °C   | 0.0358  | 0.1751  |
| 3  | 6 b  | 190  | P                             | 92.3   | mmHg | 0.0718  | 0.0799  |
| 4  | 6 b  | 191  | P                             | 149.19 | mmHg | 0.1347  | -0.1677 |
| 5  | 6 b  | 192  | P                             | 233.53 | mmHg | 0.0307  | -0.0638 |
| 6  | 6 b  | 193  | P                             | 355.1  | mmHg | 0.0273  | -0.0642 |
| 7  | 6 b  | 194  | P                             | 525.8  | mmHg | 0.0153  | -0.0254 |
| 8  | 6 b  | 195  | P                             | 760    | mmHg | 0.0549  | 0.0146  |
| 9  | 6 e  | 620  | T                             | 20     | °C   | 0.0065  | 0.028   |
| 10 | 6 e  | 621  | T                             | 39.6   | °C   | 0.0027  | 0.0266  |
| 11 | 6 e  | 622  | T                             | 55     | °C   | 0.0169  | 0.0235  |
| 12 | 6 e  | 623  | P                             | 705.06 | mmHg | 0.0272  | 0.0384  |
| 13 | 6 e  | 624  | T                             | 40     | °C   | -0.0012 | 0.0004  |

FIG. 19

| | Part | Page | Constant Temperature/ Pressure | P, T | Unit | A | B |
|---|---|---|---|---|---|---|---|
| 1 | 1 | 285 | T | 25 | °C | 2.664 | 1.2128 |
| 2 | 1 | 286 | P | 760 | mmHg | 2.535 | 0.9385 |
| 3 | 1 | 287 | P | 758 | mmHg | 2.839 | 0.8838 |
| 4 | 1 | 288 | P | 760 | mmHg | 2.4366 | 1.2151 |
| 5 | 1 | 289 | P | 760 | mmHg | 2.535 | 0.9385 |
| 6 | 1 | 290 | P | 760 | mmHg | 2.6793 | 0.9702 |
| 7 | 1 | 291 | P | 760 | mmHg | 2.9378 | 0.8239 |
| 8 | 1 | 292 | P | 760 | mmHg | 2.3537 | 1.0079 |
| 9 | 1 | 293 | T | 40 | °C | 2.4163 | 1.0414 |
| 10 | 1 | 294 | T | 60 | °C | 2.3353 | 1.0843 |
| 11 | 1 | 295 | P | 760 | mmHg | 2.4117 | 0.9683 |
| 12 | 1 | 296 | T | 90 | °C | 2.4054 | 0.8601 |
| 13 | 1 | 297 | T | 60 | °C | 2.5877 | 1.307 |
| 14 | 1 | 298 | P | 200 | mmHg | 2.7708 | 0.8634 |
| 15 | 1 | 299 | P | 400 | mmHg | 2.7438 | 0.8003 |
| 16 | 1 | 300 | P | 600 | mmHg | 2.7173 | 0.7552 |
| 17 | 1 | 301 | P | 760 | mmHg | 2.707 | 0.7172 |
| 18 | 1 | 302 | P | 745 | mmHg | 2.4939 | 0.9135 |
| 19 | 1 | 303 | T | 30 | °C | 2.6328 | 1.3569 |
| 20 | 1 | 304 | T | 45 | °C | 2.7922 | 1.0486 |
| 21 | 1 | 305 | T | 60 | °C | 2.8664 | 1.0592 |
| 22 | 1 | 306 | T | 30 | °C | 2.0618 | 1.4159 |
| 23 | 1 | 307 | T | 60 | °C | 2.2449 | 1.2106 |
| 24 | 1 | 308 | T | 30.35 | °C | 2.3619 | 1.2145 |
| 25 | 1 | 309 | T | 49.92 | °C | 2.3279 | 1.1777 |
| 26 | 1 | 310 | T | 65.94 | °C | 2.271 | 1.097 |
| 27 | 1 | 311 | T | 79.8 | °C | 2.277 | 1.0147 |
| 28 | 1 a | 236 | P | 100 | mmHg | 2.8386 | 0.6727 |
| 29 | 1 a | 237 | P | 500 | mmHg | 2.4876 | 1.357 |
| 30 | 1 a | 238 | P | 760 | mmHg | 2.2799 | 1.0268 |
| 31 | 1 a | 239 | P | 760 | mmHg | 2.7549 | 0.925 |

FIG. 20

| | Part | Page | | Constant Temperature/ Pressure | P, T | Unit | A | B |
|---|---|---|---|---|---|---|---|---|
| 1 | 3 | b | 9 | T | 50 | °C | −0.9526 | −0.6659 |
| 2 | 3 | b | 10 | T | 50 | °C | −0.9443 | −0.6663 |
| 3 | 3 | b | 11 | T | 50 | °C | −0.9253 | −0.6817 |
| 4 | 3 | b | 12 | T | 25 | °C | −0.9683 | −0.6837 |
| 5 | 3 | b | 13 | T | 35.17 | °C | −1.0631 | −0.7695 |
| 6 | 3 | b | 14 | T | 25 | °C | −1.2415 | −0.6979 |
| 7 | 3 | b | 15 | P | 760 | mmHg | −0.8769 | −0.4647 |
| 8 | 3 | b | 16 | T | 40 | °C | −1.0462 | −0.7189 |
| 9 | 3 | b | 17 | T | 50 | °C | −0.0245 | −0.6795 |
| 10 | 3 | b | 18 | T | 50 | °C | −0.4996 | −0.6897 |
| 11 | 3 | b | 19 | P | 760 | mmHg | −1.0004 | −0.5587 |
| 12 | 3 | b | 21 | P | 760 | mmHg | −0.7539 | −0.5233 |
| 13 | 3 | b | 23 | T | 40 | °C | −0.7792 | −0.7761 |
| 14 | 3 | b | 24 | T | 55 | °C | −0.5469 | −0.6719 |
| 15 | 3 | c | 108 | T | 50 | °C | −0.9253 | −0.6817 |
| 16 | 3 | c | 110 | T | 50 | °C | −0.963-4 | −0.721 |
| 17 | 3 | c | 111 | T | 30 | °C | −1.0908 | −0.7547 |
| 18 | 3 | c | 112 | P | 760 | mmHg | −0.7949 | −0.6627 |
| 19 | 3 | c | 113 | T | 30 | °C | −1.1442 | −0.7849 |
| 20 | 3 | c | 114 | P | 705.06 | mmHg | −0.816 | −0.6805 |
| 21 | 3 | c | 115 | P | 760 | mmHg | −0.8355 | −0.4992 |
| 22 | 3 | c | 116 | P | 760 | mmHg | −0.7813 | −0.5782 |
| 23 | 3-4 | | 87 | T | 28.15 | °C | −1.0961 | −0.6115 |
| 24 | 3-4 | | 88 | T | 40.4 | °C | −0.7639 | −0.8306 |
| 25 | 3-4 | | 89 | T | 55.1 | °C | −0.7471 | −0.5629 |
| 26 | 3-4 | | 90 | P | 760 | mmHg | −0.6133 | −0.5016 |
| 27 | 3-4 | | 91 | P | 760 | mmHg | −0.7123 | −0.6588 |
| 28 | 3-4 | | 92 | P | 760 | mmHg | −0.8404 | −0.561 |
| 29 | 3-4 | | 93 | P | 760 | mmHg | −1.0482 | −0.6055 |
| 30 | 3-4 | | 94 | T | 35 | °C | −1.0198 | −0.8017 |
| 31 | 3-4 | | 95 | T | 45 | °C | −0.956 | −0.7299 |
| 32 | 3-4 | | 96 | T | 55 | °C | −0.9235 | −0.691 |
| 33 | 3-4 | | 97 | P | 760 | mmHg | −0.8517 | −0.6597 |
| 34 | 3-4 | | 98 | T | 25 | °C | −0.6141 | −0.7463 |
| 35 | 3-4 | o | 99 | T | 25 | °C | −1.1723 | −0.7856 |
| 36 | 3-4 | o | 100 | T | 35 | °C | −1.0218 | −0.73-48 |
| 37 | 3-4 | o | 101 | T | 50 | °C | −0.855 | −0.6087 |
| 38 | 3-4 | o | 102 | T | 25 | °C | −1.227 | −0.9551 |
| 39 | 3-4 | o | 104 | T | 50 | °C | −1.1938 | −0.849 |
| 40 | 3-4 | o | 106 | P | 760 | mmHg | −0.7286 | −0.5689 |
| 41 | 3-4 | o | 107 | P | 760 | mmHg | −0.8392 | −0.5657 |
| 42 | 3-4 | o | 108 | T | 15 | °C | −1.3122 | −0.8931 |
| 43 | 3-4 | o | 109 | T | 20 | °C | −1.2205 | −0.8819 |
| 44 | 3-4 | o | 110 | T | 30 | °C | −1.1476 | −0.7717 |
| 45 | 3-4 | o | 111 | T | 35 | °C | −1.0557 | −0.7603 |
| 46 | 3-4 | o | 112 | T | 40 | °C | −1.0135 | −0.7167 |
| 47 | 3-4 | o | 113 | T | 50 | °C | −0.8998 | −0.6596 |
| 48 | 3-4 | o | 114 | T | 55 | °C | −0.8268 | −0.6713 |
| 49 | 3-4 | o | 115 | P | 760 | mmHg | −0.9166 | −0.4856 |
| 50 | 3-4 | o | 116 | T | 0 | °C | −0.6632 | −0.9089 |
| 51 | 3-4 | o | 117 | T | 10 | °C | −0.838 | −1.2639 |
| 52 | 3-4 | o | 118 | T | 20 | °C | −0.805 | −1.0303 |
| 53 | 3-4 | o | 119 | T | 30 | °C | −0.5948 | −0.9382 |
| 54 | 3-4 | o | 120 | T | 50 | °C | −0.3922 | −0.8919 |
| 55 | 3-4 | o | 121 | P | 760 | mmHg | −0.7748 | −0.6374 |
| 56 | 3-4 | o | 122 | P | 732 | mmHg | −0.599 | −0.6021 |
| 57 | 3-4 | o | 123 | P | 738 | mmHg | −0.8066 | −0.6287 |
| 58 | 3-4 | o | 124 | P | 750 | mmHg | −1.1261 | −0.5054 |
| 59 | 3-4 | o | 125 | T | 35.17 | °C | −1.0105 | −0.756 |

FIG. 21

| Temperature (°C) | $(x_1)_2$ | $(x_1)_1$ |
|---|---|---|
| 5 | 0.02502 | 0.5011 |
| 10 | 0.02322 | 0.5019 |
| 15 | 0.02128 | 0.5048 |
| 20 | 0.02017 | 0.5081 |
| 25 | 0.01892 | 0.5112 |
| 30 | 0.01818 | 0.5166 |
| 35 | 0.0175 | 0.5233 |
| 40 | 0.01688 | 0.5285 |
| 50 | 0.01651 | 0.5432 |
| 60 | 0.01667 | 0.5599 |
| 70 | 0.01723 | 0.581 |
| 80 | 0.01767 | 0.597 |
| 26 | 0.01662 | 0.5039 |
| 50 | 0.01554 | 0.5224 |
| 37.78 | 0.01608 | 0.5254 |
| 37.78 | 0.01851 | 0.5117 |
| 26.7 | 0.01878 | 0.5148 |
| 27 | 0.01797 | 0.5055 |
| 30 | 0.01742 | 0.507 |
| 25 | 0.01797 | 0.5178 |
| 25 | 0.01851 | 0.5055 |
| 20 | 0.02097 | 0.5086 |
| 20 | 0.01237 | 0.5023 |
| 75 | 0.01316 | 0.5678 |
| 25 | 0.01854 | 0.5058 |
| 123 | 0.05966 | 0.8313 |
| 26 | 0.01662 | 0.5039 |
| 50 | 0.01554 | 0.5224 |
| 37.78 | 0.01608 | 0.5254 |
| 37.78 | 0.01851 | 0.5117 |
| 26.7 | 0.01878 | 0.5148 |
| 27 | 0.01797 | 0.5055 |
| 30 | 0.01742 | 0.507 |
| 25 | 0.01797 | 0.5178 |
| 25 | 0.01851 | 0.5055 |
| 20 | 0.02097 | 0.5086 |
| 20 | 0.01237 | 0.5023 |
| 75 | 0.013116 | 0.5678 |
| 25 | 0.01854 | 0.5048 |
| 123.1 | 0.05966 | 0.8313 |
| 124.3 | 0.09312 | 0.8774 |

FIG. 22

| Temperature (°C) | $(x_1)_2$ | $(x_1)_1$ |
|---|---|---|
| 73 | 0.05198 | 0.413 |
| 25 | 0.07311 | 0.3079 |
| 25 | 0.06798 | 0.3055 |
| 20 | 0.0834 | 0.3553 |
| 20 | 0.08587 | 0.3442 |
| 25 | 0.07903 | 0.347 |
| 30 | 0.07337 | 0.3499 |
| 25 | 0.078 | 0.3638 |
| 25 | 0.07461 | 0.3079 |
| −18.51 | 0.1697 | 0.3965 |
| −0.6 | 0.1414 | 0.3766 |
| −2.53 | 0.1277 | 0.3757 |
| 25 | 0.07611 | 0.3659 |
| 37.78 | 0.06725 | 0.3638 |
| 26.7 | 0.07311 | 0.3638 |
| 25 | 0.07686 | 0.3574 |
| 30 | 0.06086 | 0.331 |
| −11.4 | 0.1629 | 0.3784 |
| 5 | 0.1154 | 0.3743 |
| 25 | 0.07876 | 0.3444 |
| 50 | 0.06086 | 0.3722 |
| 65 | 0.05299 | 0.3985 |
| 85 | 0.054 | 0.4345 |
| 115 | 0.06262 | 0.546 |
| 140 | 0.1039 | 0.7291 |

FIG. 23

| Temperature K | $p_{1s}$ MPa | $p_{2s}$ MPa | A | B |
|---|---|---|---|---|
| 260 | 2.42 | 1.72 | 0.905 | 1.3 |
| 283.15 | 4.51 | 3.03 | 0.327 | 1.323 |
| 269.25 | 3.14 | 2.18 | 0.674 | 1.283 |
| 255.34 | 2.11 | 1.52 | 0.906 | 1.328 |
| 241.45 | 1.35 | 1.01 | 0.984 | 1.447 |
| 252.95 | 1.96 | 1.42 | 0.964 | 1.319 |
| 288.71 | 5.17 | 3.43 | 0.298 | 1.351 |
| 266.48 | 2.91 | 2.03 | 0.703 | 1.297 |
| 244.26 | 1.49 | 1.1 | 0.946 | 1.489 |
| 222.04 | 0.65 | 0.53 | 1.206 | 1.782 |
| 293.15 | 5.74 | 3.78 | 0.436 | 1.148 |
| 283.15 | 4.51 | 3.03 | 0.531 | 1.219 |
| 263.15 | 2.65 | 1.87 | 0.73 | 1.319 |
| 243.15 | 1.43 | 1.07 | 0.938 | 1.458 |
| 223.15 | 0.68 | 0.55 | 1.203 | 1.658 |
| 250 | 1.79 | 1.31 | 0.856 | 1.435 |
| 298.15 | 6.45 | 4.2 | 0.447 | 1.045 |
| 293.15 | 5.74 | 3.78 | 0.511 | 1.14 |
| 291.15 | 5.48 | 3.62 | 0.508 | 1.213 |
| 288.15 | 5.1 | 3.39 | 0.514 | 1.253 |
| 283.15 | 4.51 | 3.03 | 0.589 | 1.225 |

HIGHLY ACCURATE CORRELATING METHOD FOR PHASE EQUILIBRIUM DATA, AND PHASE EQUILIBRIUM CALCULATION METHOD

CROSS-REFERENCE TO RELATED APPLICATIONS

This application is a U.S. national stage application under 35 USC 371 of PCT/JP2012/074514 filed Sep. 25, 2012 and claims foreign priority benefit of Japanese Application No. 2011-215133 filed Sep. 29, 2011 in the Japanese Intellectual Property Office, the contents of which are incorporated herein by reference.

TECHNICAL FIELD

The present invention relates to a highly accurate method for correlation of phase equilibrium data using relationships between infinite dilution pressure gradients and vapor pressures, and a method for prediction of phase equilibrium data using this highly accurate method for correlation of phase equilibrium data. The present invention also relates to a method and an apparatus for designing or controlling a component separator or refiner such as a distillation column, an extraction column, or a crystallizer on the basis of values obtained by the method for prediction of phase equilibrium data. The present invention further relates to a program for designing or controlling a component separator or refiner such as a distillation column, an extraction column, or a crystallizer.

BACKGROUND ART

A chemical production process involves a reaction step followed by the step of separating or refining products from by-products. This process often uses distillation and also commonly uses absorption, extraction, or crystallization. Meanwhile, distillation columns are used in component separation for petroleum. Also, component separation is performed in natural gas refining. The component separation principle in such a separation/refining step is based on phase equilibrium relationship. Vapor-liquid equilibrium (VLE) for distillation or absorption, liquid-liquid equilibrium (LLE) for extraction, and solid-liquid equilibrium (SLE) for crystallization serve as central factors determining separation limits or energies required for separation. Thus, rational apparatus or operational design or process step selection cannot be performed without the determination of precise phase equilibrium relationship.

Although the phase equilibrium relationship is exceedingly important for chemical, petroleum, or natural gas refining as described above, a problem that is faced by using the phase equilibrium relationship in such a chemical production or petroleum or natural gas refining step is the imprecise prediction of the phase equilibrium relationship. This is because non-ideality in the liquid phase (i.e., the property in which the mixture is no longer regarded as a single component due to the value of activity coefficient deviated from 1) cannot be predicted. Fundamental problems that are encountered in trying to solve this problem are the unpredictable intermolecular interaction strength and molecular orientation of non-ideal solutions. This blocks theoretical progress. There also remains a practical issue: unknown phase equilibrium relationship hinders a production process from being determined or an apparatus from being designed. Taking distillation column design as an example, the number of contact stages or the height of a packed column cannot be determined. Under the circumstances, the phase equilibrium relationship is actually measured for a system that is subject to separation, and correlated with operating parameters, and the resulting correlation is used in design calculation. Although a lot of vapor-liquid equilibrium data (see e.g., Non-patent Document 1), liquid-liquid equilibrium data (see e.g., Non-patent Document 2), or solid-liquid equilibrium data has been reported for use in the design of the separator, every such data is actually measured values. The actually measured values, however, are accompanied by errors (statistical errors responsible for variations and systematic errors responsible for imprecision). In fact, since precise phase equilibrium relationship is unknown, apparatus design is performed in expectation of large safety factors in order to secure product properties (e.g., purity) or productivity (i.e., yield). Such large safety factors are significantly economically inefficient because chemical production uses large-scale apparatus. Hereinafter, thermodynamic relationship satisfied by true values free from such errors will be described first.

When phases I and II reach equilibrium upon contact, the equilibrium relationship of components constituting these phases with component i is given by the following equation (see e.g., Non-patent Document 3):

[Formula 1]

$$(f_i)_I = (f_i)_{II} \qquad (1)$$

(Method for Correlation of Low-Pressure Binary Vapor-Liquid Equilibrium Data)

First, assuming that liquid and vapor phases consisting of components 1 and 2 are in equilibrium at a low pressure, the equation (1) is specifically represented as follows for this low-pressure binary vapor-liquid equilibrium (VLE) (see e.g., Non-patent Document 3):

[Formula 2]

$$Py_1 = \gamma_1 x_1 p_{1s} \qquad (2)$$

[Formula 3]

$$Py_2 = \gamma_2 x_2 p_{2s} \qquad (3)$$

wherein P represents a system pressure; $y_1$ and $y_2$ represent the mole fractions of components 1 and 2, respectively, in the vapor phase; $x_1$ and $x_2$ represent the mole fractions of components 1 and 2, respectively, in the liquid phase; $\gamma_1$ and $\gamma_2$ represent the activity coefficients of components 1 and 2, respectively, in the liquid phase; $p_{1s}$ and $p_{2s}$ represent the vapor pressures of components 1 and 2, respectively, at a system temperature T. The activity coefficients are introduced for representing non-ideality in the liquid phase. $\gamma_i$ (activity coefficient of component i)=1 holds for ideal solutions. Many activity coefficient equations have been proposed for indicating non-ideality in the liquid phase. For example, the equation (4) or (5) (the Margules equation) is often used as the activity coefficient equation. Other known activity coefficient equations include van Laar, UNIQUAC, NRTL, Wilson, and Redlich-Kister equations.

[Formula 4]

$$\ln \gamma_1 = x_2^2 [A + 2(B-A)x_1] \qquad (4)$$

[Formula 5]

$$\ln \gamma_2 = x_1^2 [B + 2(A-B)x_2] \qquad (5)$$

wherein $x_1$ represents the mole fraction of component 1 in the liquid phase, and $x_2$ represents the mole fraction of component 2 in the liquid phase. Binary parameters A and B are given by the following equations (6) and (7):

[Formula 6]

$$A = \ln \gamma_1^\infty \quad (6)$$

[Formula 7]

$$B = \ln \gamma_2^\infty \quad (7)$$

wherein $\gamma_1^\infty$ and $\gamma_2^\infty$ represent the infinite dilution activity coefficients of components 1 and 2, respectively, in the liquid phase. Specifically, the binary parameters A and B are expressed in terms of the infinite dilution activity coefficients $\gamma_1^\infty$ and $\gamma_2^\infty$ by considering $x_1 \to 0$ and $x_2 \to 0$ as limits in the equations (4) and (5).

Specifically, P-x data and P-y data for the methanol (1)-water (2) system at a temperature of 323.15 K are shown in FIG. 1 taking the correlation of VLE data as an example.

In FIG. 1, the open circle (○) denotes actually measured values of P-$x_1$ relationships (see Part 1, p. 56 of Non-patent Document 1), and the filled circle (●) denotes actually measured values of P-$y_1$ relationships (see Part 1, p. 56 of Non-patent Document 1).

The system pressure P is given by the following equation (8) from the sum of the equations (2) and (3) by considering $y_1 + y_2 = 1$:

[Formula 8]

$$P = \gamma_1 x_1 p_{1s} + \gamma_2 x_2 p_{2s} \quad (8)$$

The binary parameters A and B were determined using the method of least squares to most represent actually measured P-x relationships. From the values of A and B (A=0.6506 and B=0.5204) thus determined, P-x relationships were calculated according to the Margules equation and indicated by the solid line (-) in FIG. 1.

Also, P-$y_1$ relationships were calculated according to the following equation (9) using the binary parameters A and B representing P-x relationships and indicated by the dotted line ( . . . ) in FIG. 1.

[Formula 9]

$$y_1 = \gamma_1 x_1 p_{1s} / P \quad (9)$$

Likewise, binary parameters A and B correlating constant-pressure binary vapor-liquid equilibrium data can also be determined. In addition to the Margules equation, other activity coefficient equations, such as van Laar, Wohl, UNIQUAC, NRTL, and Wilson equations, may be used in the correlation (see Non-patent Document 3). Non-patent Document 1 discloses examples of correlation of binary vapor-liquid equilibrium data for more than 12500 systems. Also, this literature provides binary parameters most representing constant-temperature P-x data and constant-pressure T-x data using each activity coefficient equation. Further, this literature provides binary parameters most representing constant-temperature P-x-y data and constant-pressure T-x-y data using vapor-phase mole fraction data. These binary parameters can be converted to A and B that provide infinite dilution activity coefficients. Even if binary parameters representing P-x data are determined using the activity coefficient equation, correlation results do not always produce true values due to measurement errors (statistical errors and systematic errors) contained in the data. Depending on VLE data, there may exist an activity coefficient equation that is capable of correlation with particularly high accuracy. The precision of VLE data, however, is not directly related to correlation errors unless experimental errors are removed. A method for determining binary parameters by excluding measurement errors from VLE data has not yet been found, though the vapor-liquid equilibrium relationship can be determined from the given two binary parameters, A and B.

(Method for Correlation of Binary Liquid-Liquid Equilibrium Data)

When liquid phases I and II consisting of a binary system are in liquid-liquid equilibrium, the equation (1) is specifically represented as follows (see Non-patent Document 3):

[Formula 10]

$$(\gamma_i x_i)_I = (\gamma_i x_i)_{II} \quad (10)$$

[Formula 11]

$$\sum_{i=1}^{2} (x_i)_I = 1, \sum_{i=1}^{2} (x_i)_{II} = 1 \quad (11)$$

wherein $\gamma_i$ represents the activity coefficient of component i in each liquid phase I or II, and $x_i$ represents the mole fraction of component i in each liquid phase.

For data correlation, parameters A and B can be determined according to the equations (4), (5), and (10) from binary liquid-liquid equilibrium data (mutual solubility data) at one temperature, for example, in the case of using the Margules equation. Unfortunately, a method for accurately correlating relationships between the parameter A and temperature over a wide temperature range has not yet been found. This holds true for relationships between the parameter B and temperature.

Non-patent Document 2 discloses a lot of binary mutual solubility data. Values of binary parameters were determined according to the UNIQUAC activity coefficient equation for each mutual solubility data. As specific examples, binary liquid-liquid equilibrium data for the 1-butanol (1)-water (2) system is shown in FIG. 2(a), and binary liquid-liquid equilibrium data for the 2-butanone (1)-water (2) system is shown in FIG. 2(b). A method for favorably predicting a method for correlation of the temperature dependence of such mutual solubility has not yet been found. In FIGS. 2(a) and 2(b), the open circle (○) denotes actually measured values of $(x_1)_2$ (see Non-patent Document 2), and the filled circle (●) denotes actually measured values of $(x_1)_1$ (see Non-patent Document 2). In this context, $(x_1)_1$ represents the mole fraction of component 1 in liquid phase I, and $(x_1)_2$ represents the mole fraction of component 1 in liquid phase II. The ordinate denotes a temperature (T−273.15 K).

(Method for Correlation of High-Pressure Binary Vapor-Liquid Equilibrium Data)

In one approach, the equation (1) is specifically represented as follows for high-pressure vapor-liquid equilibrium data (see Non-patent Document 3):

[Formula 12]

$$\phi_{iV} y_i = \phi_{iL} x_i \quad (12)$$

wherein $\phi_{iV}$ represents the fugacity coefficient of component i in the vapor-phase mixture; $\phi_{iL}$ represents the fugacity coefficient of component i in the liquid-phase mixture; $x_i$ represents the mole fraction of component i in the liquid phase; and $y_i$ represents the mole fraction of component i in the vapor phase. The fugacity coefficients are used in the high-pressure system to represent not only non-ideality in the vapor phase, but also non-ideality in the liquid phase. The fugacity coefficients can be expressed using the equation of state and mixing rules for pure components, albeit in a complicated manner. The mixing rules include system-dependent interaction parameters. The method used involves adjusting values of the interaction parameters to simultaneously correlate high-pressure P-x data and P-y data. The interaction parameters thus obtained by correlation are further used in the prediction of phase equilibrium relationship. Such a method for correlation of high-pressure phase equilibrium has the disadvantages that: i) the calculation of fugacity coefficients is complicated; ii) interaction parameters do not exhibit correlation as a function of operating parameters (temperature, pressure, etc.) or factors characteristic of the system (polarizability, etc.); and iii) some regions including the vicinity of critical points are observed with significantly low correlation accuracy.

Secondly, the high-pressure vapor-liquid equilibrium is represented by expressing non-ideality in the liquid phase in terms of activity coefficients and given as follows (see Non-patent Document 3):

[Formula 13]

$$\phi_{iV} P y_i = \gamma_i^{(Pa)} x_i p_{is} \exp\frac{v_{iL}(P-Pa)}{RT} \exp\frac{v_i^o(P-p_{is})}{RT} \quad (13)$$

wherein $\gamma_i^{(Pa)}$ represents the activity coefficient of component i at a system temperature T and a pressure Pa in the liquid phase; $v_{iL}$ represents the partial molar volume of component i in the liquid phase; $v_i^o$ represents the molar volume of pure liquid i; and R represents a gas constant. In this context, $\phi_{iV}$ represents the fugacity coefficient of component i in the vapor-phase mixture; $x_i$ represents the mole fraction of component i in the liquid phase; $y_i$ represents the mole fraction of component i in the vapor phase; P represents a system pressure; and $P_{is}$ represents the vapor pressure of component i at a system temperature T.

The equation (13) expresses non-ideality in the vapor phase in terms of fugacity coefficients and thus incorporates three disadvantages described above in their entirety. Although non-ideality in the liquid phase is also expressed in terms of activity coefficients, this is not practical due to insufficient physical data (e.g., partial molar volume) necessary for determining exponential terms on the right side representing pressure dependence. The correlation of high-pressure vapor-liquid equilibrium data is much more complicated than that of low-pressure data. For apparatus design, there is no choice but to adopt a method using data obtained in a practical operating range.

The values of A and B must be known for the prediction of phase equilibrium using activity coefficients shown above. Since excess partial molar free energies are obtained by multiplying logarithmic values of the infinite dilution activity coefficients represented by the equations (6) and (7) by RT, $\ln \gamma_1^\infty$ and $\ln \gamma_2^\infty$ are naturally predicted to be monotone functions of 1/T, as in many thermodynamic rules. Non-patent Document 1 has reported 60 vapor-liquid equilibrium data sets for the methanol (1)-water (2) system and also reported values of Margules binary parameters A and B representing these VLE data sets. Thus, a plot of A=$\ln \gamma_1^\infty$ and B=$\ln \gamma_2^\infty$ for the methanol (1)-water (2) system against 1/T is shown in FIG. 3. For low-pressure data, $\ln \gamma_1^\infty$ and $\ln \gamma_2^\infty$ must be single functions (single-valued functions) of temperature. As is evident from FIG. 3, the data sets are too variable to fix a representative line. This holds true for $\ln \gamma_1^\infty$ and $\ln \gamma_2^\infty$ determined using other activity coefficient equations, such as the UNIQUAC equation. Also, plots of $\ln \gamma_1^\infty$ and $\ln \gamma_2^\infty$ for other binary systems against 1/T produce similar results. This fact that $\ln \gamma_1^\infty$ and $\ln \gamma_2^\infty$ representing non-ideality in the liquid phase cannot be represented as single functions of temperature is the greatest reason for hampering the highly accurate correlation of vapor-liquid equilibrium data and the prediction of equilibrium relationship. In spite of more than 100 years since the introduction of the Margules equation, the accurate method for correlation of binary parameters remains undeveloped.

By contrast, a group contribution method, such as the UNIFAC or ASOG method, involves dividing molecules in the phase equilibrium-forming system into atomic groups such as $CH_2$ and OH, determining the rates of contribution of the atomic groups to binary parameters from a large number of binary phase equilibrium data, and predicting phase equilibrium using the rates. This method, albeit simple, exhibits significantly low prediction accuracy and is thus used only for grasping the outline of phase equilibrium. Still, measurement data must be used for detailed design.

Recently, the present inventor has found an accurate method for correlation of phase equilibrium data and filed patent applications (Japanese Patent Application Nos. 2010-58632 (Patent Document 1) and 2010-112357 (Patent Document 2)). This correlation utilizes the property in which phase equilibrium data highly accurately converges to the thermodynamic consistency line represented by the equation (14):

[Formula 14]

$$\beta = \frac{F}{|B-A|} = aP^b \quad (14)$$

wherein A and B represent binary parameters; P represents a system pressure; a and b represent constants specific for the binary system; β represents a polarity exclusion factor; and F represents deviation from A=B in the one-parameter Margules equation. F is defined according to the following equation:

[Formula 15]

$$F = \frac{100}{n}\sum_{k=1}^{n}\left|\frac{y_{1k,smooth}-y_{1k,M1}}{y_{1k,M1}}\right| \quad (15)$$

wherein $y_{1k,smooth}$ represents a value of the mole fraction $y_1$ of component 1 in the vapor phase with respect to $x_{1k}$ (value of $x_1$ in the k-th part of the liquid-phase mole fraction $x_1$ of component 1 divided into n equal parts (e.g., n=40) between 0 and 1). The value of $y_{1k,smooth}$ is determined using the equations (2) to (5) and (9) from binary parameters A and B determined to represent P-x relationships. $y_{1k,M1}$ represents a value of $y_1$ calculated using one parameter obtained by the correlation of P-x relationships using the one-parameter Margules equation that satisfies A=B (Patent Document 1). Alternatively, the value of $y_{1k,M1}$ may be calculated more simply according to the one-parameter Margules equations shown below and the equations (2) and (3) using E determined according to the following equation (16) using Margules equation incorporating one parameter E (=A=B) in activity coefficients in the equation (8):

[Formula 16]

$$P = e^{x_2^2 E} x_1 p_{1s} + e^{x_1^2 E} x_2 p_{2s} \quad (16)$$

(Patent Document 2 and Non-patent Document 4). E is defined according to the following one-parameter Margules equations wherein $x_1$ and $x_2$ represent the mole fractions of components 1 and 2, respectively, in the liquid phase; P represents a system pressure; and $p_{1s}$ and $p_{2s}$ represent the vapor pressures of components 1 and 2, respectively, at a system temperature T:

[Formula 17]

$$\ln \gamma_1 = x_2^2 E \quad (17)$$

[Formula 18]

$$\ln \gamma_2 = x_1^2 E \quad (18)$$

wherein $\gamma_1$ and $\gamma_2$ represent the activity coefficients of components 1 and 2, respectively.

The equation (14) indicates relationships for constant-pressure data. For constant-temperature data, an average vapor pressure $p_{s,ave}$ obtained according to the following equation can be used instead of P:

[Formula 19]

$$p_{s,ave} = \frac{p_{1s} + p_{2s}}{2} \quad (19)$$

The thermodynamic consistency line of constant-temperature data agrees with that of constant-pressure data (Patent Document 2 and Non-patent Document 4). This property relating to VLE data, i.e., the property in which constant-pressure data and constant-temperature data exhibit the same thermodynamic consistency lines, has been found for the first time by the invention described in Japanese Patent Application No. 2010-112357 (Patent Document 2). The correlation based on the equation (14) is highly accurate. Taking the 60 data sets for the methanol (1)-water (2) binary system described above as an example, correlation errors derived from the equation (14) are merely 0.25% for 18 constant-temperature data sets and 0.55% for 42 constant-pressure data sets, demonstrating the exceedingly high convergence of β vs. pressure relationships compared with the low convergence of A and B shown in FIG. 3. Many examples of thermodynamic consistency lines are shown in Non-patent Document 4.

The values of two binary parameters, A and B, must be known as functions of temperature or pressure in order to predict binary vapor-liquid equilibrium relationship using activity coefficients. In the prediction of phase equilibrium relationship using the thermodynamic consistency line obtained in the invention described in the patent application mentioned above, the equilibrium relationship cannot be determined directly because only one relationship of A and B (only the thermodynamic consistency line) is known. Thus, it is required to find highly converged correlations of A and B independent of the equation (14). For this purpose, relationships between the following deviation D from the Gibbs-Duhem equation and experimental errors can be used (Patent Document 1):

[Formula 20]

$$D = 2(B-A)\Delta x_1^2 \quad (20)$$

wherein D represents deviation from the Gibbs-Duhem equation, and $\Delta x_1$ represents an experimental error appearing in the mole fraction of component 1 in the liquid phase. The equation (20) is an approximation of the Gibbs-Duhem (GD) equation obtained by applying the Margules equation to the activity coefficient incorporated in the GD equation under isothermal and isobaric conditions and applying the central difference scheme to the derivative of $\ln \gamma_i$ with respect to change in $x_1$.

According to the Gibbs-Duhem equation, D=0 in the following equation:

[Formula 21]

$$D = x_1 \frac{d\ln\gamma_1}{dx_1} + (1-x_1)\frac{d\ln\gamma_2}{dx_1} \quad (21)$$

wherein $x_1$ represents the mole fraction of component 1, and $\gamma_1$ and $\gamma_2$ represent the activity coefficients of components 1 and 2, respectively.

The values of activity coefficients representing binary vapor-liquid equilibrium data must satisfy the Gibbs-Duhem equation, i.e., D=0, under constant-temperature and constant-pressure conditions. Since the values of B and A representing VLE data are different from each other, the equation (20) shows that the GD equation is not satisfied unless experimental errors are removed. This means that precise phase equilibrium relationship does not hold in $\Delta x_1 \neq 0$. Since a method for eliminating experimental errors has not been found previously, a method for prediction of phase equilibrium has not been established. The method for eliminating experimental errors is to obtain converged correlations using a lot of phase equilibrium data which are obtained in different measurement apparatuses, measurement methods, or measurers. The equation (14) provides linear relationships that hold for data differing in apparatuses, methods, or measurers. Thus, consistent relationships that satisfy the GD equation without errors are shown on this line.

CITATION LIST

Patent Documents

Patent Document 1: Japanese Patent Publication No. 2011-189297
Patent Document 2: Japanese Patent Publication No. 2011-242162

Non-Patent Documents

Non-patent Document 1: J. Gmehling, U. Onken, "Vapor-Liquid Equilibrium Data Collection", DECHEMA Chemistry Data Series, Vol. I, Part 1-8a, 1977
Non-patent Document 2: J. M. Sorensen, W. Arlt, "Liquid-Liquid Equilibrium Data Collection, Binary Systems", Chemistry Data Series, Vol. V, Part 1, 1979
Non-patent Document 3: R. C. Reid, J. M. Prausnitz, B. E. Poling, "The Properties of Gases and Liquids", McGraw-Hill, New York, N.Y., 1987
Non-patent Document 4: S. Kato, "An empirical consistency test using thermodynamic consistency lines for the VLE data of 7262 constant-temperature and 5167 constant-pressure binaries", Fluid Phase Equilibria, 302 (2011) 202-212

Non-patent Document 5: S. Kato, H. Tachibana, "Thermodynamic Consistency Lines of the 511 Mutual Solubility Data and the VLE Data of 7262 Constant-Temperature and 5167 Constant-Pressure Binaries", Solvent Extraction Research and Development, Japan, Vol. 18 (2011) 85-92

Non-patent Document 6: H. Knapp, R. Doring, L. Which, U. Plocker, J. M. Prausnitz, "Vapor-Liquid Equilibria for Mixtures of Low Boiling Substances", Dechema Chem. Data Series, Vol. VI 1982

Non-patent Document 7: K. Kojima, S. Zhang, T. Kiaki, "Measuring Methods of Infinite Dilution Activity Coefficients and a Data base for Systems Including Water", Fluid Phase Equilib., 131 (1997), 145-179

Non-patent Document 8: K. WohL, "Thermodynamic Evaluation of Binary and Ternary Liquid Systems", Trnas AIChE., 42, 215 (1946)

SUMMARY OF INVENTION

Technical Problem

As described above, methods for correlation and prediction of phase equilibrium data cannot be completed without finding a method for obtaining one or at least one converged correlation in addition to the equation (14). An object of the present invention is to provide a method for obtaining the additional converged correlation.

A further object of the present invention is to provide a method for prediction of phase equilibrium using one set of infinite dilution activity coefficients or binary parameters A and B obtained from the thus-obtained two or more converged correlations.

A further object of the present invention is to provide a method for designing or controlling a component separator or a refiner using values obtained by the method for prediction of phase equilibrium data, an apparatus for designing or controlling a component separator or a refiner, and a program for designing this design or control apparatus.

Solution to Problem

In order to attain the objects, the present inventor has made attempts at many correlation methods. Some of these many correlation methods were performed by inference and the others were tested at random. This is because a method for obtaining true values by removing experimental errors from measurement data (in this case, which is synonymous with a method for satisfying the Gibbs-Duhem equation by removing experimental errors) cannot be obtained by guess. The present situation, where a method for obtaining true values of phase equilibrium relationship has not been found over a long period exceeding 100 years, validates the fact that the method for obtaining true values by removing experimental errors is not guessable.

The present inventor has variously devised plots on the abscissa and the ordinate for the purpose of finding a correlation method for converging a lot of binary VLE data obtained by many measurers using different apparatuses and methods, as single functions (single-valued functions) of a certain independent variable. The present inventor has made attempts at highly accurate correlation considering, for example, operating parameters, the physical properties of systems, and thermodynamic properties relating to entropy and enthalpy effects in order to reflect the principle that holds for phase equilibrium. These attempts also include an approach of advancing the thermodynamic consistency line according to the invention described in the patent application mentioned above. Unfortunately, the invention described in the patent application has the great disadvantage that, as is clearly demonstrated by the equation (15), it cannot reflect the basic nature in which phase equilibrium relationship is a continuous function of composition, because the phase equilibrium relationship (relationship of T, P, $x_1$, and $y_1$) is analyzed using only discrete values. In spite of attempts at many correlation factors to obtain highly accurate correlation based on but independent of the invention described in the patent application mentioned above, the highly accurate correlation based on the invention described in the patent application has not succeeded due to this fundamental disadvantage. Thus, the present inventor has made attempts at many correlation factors on the basis of continuous phase equilibrium relationships for composition and consequently found a highly accurate correlation method using a derivative relating to $x_1$ as shown below.

Specifically, the present invention relates to a method for correlation of binary phase equilibrium data, comprising calculating an index X of proximity ratio to critical points and infinite dilution pressure gradients $Y_1$ and $Y_2$ using binary phase equilibrium measurement data, and correlating the obtained index X of proximity ratio to critical points with the infinite dilution pressure gradients $Y_1$ and $Y_2$ to calculate infinite dilution activity coefficients and $\gamma_2^\infty$ or binary parameters A and B from the X-$Y_1$ correlation and the X-$Y_2$ correlation, respectively. In this method, the index X of proximity ratio to critical points can be calculated according to the following equation (22), and the infinite dilution pressure gradients $Y_1$ and $Y_2$ can be calculated according to the following equations (24) and (25), and it is preferred to use these equations for the calculations:

Index X of Proximity Ratio to Critical Points:

[Formula 22]

$$X = \frac{p_{1s} + p_{2s}}{P_{c1} + p_{2s}} \tag{22}$$

wherein $P_{c1}$ represents the critical pressure of component 1 in the binary system, and $p_{1s}$ and $p_{2s}$ represent the vapor pressures of components 1 and 2, respectively, at a temperature T.

Preferably, a component having a high vapor pressure in a temperature range to be analyzed is assigned into component 1 while a component having a low vapor pressure in this range is assigned into component 2. In the case where the high and low vapor pressures may be inverted in the temperature range to be analyzed, the component assignment may be fixed on the basis of the relationship between high and low vapor pressures at a temperature of, for example, 298.15 K. The equation (22) is used in the analysis of constant-temperature data. For the analysis of constant-pressure data, X may be calculated using vapor pressures at an arithmetic average temperature $t_{b,ave}$ for the boiling points of a pure component at a system pressure. Specifically, for the analysis of constant-pressure data, boiling points $t_{b1}$ and $t_{b2}$ of a pure component can be determined from a system pressure P; an average value $t_{b,ave}$ can be determined according to the equation (23); and X can be determined according to the equation (22) using vapor pressures $p_{1s}$ and $p_{2s}$ at the average temperature $t_{b,ave}$.

[Formula 23]
$$t_{b,ave} = \frac{t_{b1} + t_{b2}}{2} \quad (23)$$

wherein $t_{b1}$ and $t_{b2}$ represent the boiling points of components 1 and 2, respectively, at a system pressure P.

When the critical temperature of component 1 is defined as $T_{c1}$, the equation (22) shows X=0 at a temperature T=0 and X=1 at $T=T_{c1}$. Accordingly, X represents an index of proximity ratio to critical points.

Infinite Dilution Pressure Gradients $Y_1$ and $Y_2$:

[Formula 24]
$$Y_1 = \frac{\gamma_1^\infty p_{1s} - p_{2s}}{P_{c1} - p_{2s}} \quad (24)$$

[Formula 25]
$$Y_2 = \frac{p_{1s} - \gamma_2^\infty p_{2s}}{P_{c1} - p_{2s}} \quad (25)$$

wherein $\gamma_i^\infty$ represents the infinite dilution activity coefficient of component i in the liquid phase; and $P_{c1}$, $P_{1s}$, and $P_{2s}$ are as defined in the equation (22).

In this context, a numerator on the right side of the equation (24) is equal to $(\partial P/\partial x_1)|_{x_1=0}$ ($\partial P/\partial x_1$ at $x_1=0$) at a system temperature T, and a numerator on the right side of the equation (25) is equal to $(\partial P/\partial x_1)|_{x_1=1}$ at a system temperature T. $\partial P/\partial x_1$ indicates that P is differentiated partially by $x_1$ at constant T. Thus, $Y_1$ and $Y_2$ represent infinite dilution nondimensional pressure gradients. The essence of the present invention is that the infinite dilution pressure gradients are introduced for the correlation of phase equilibrium data.

The denominators in the equations (24) and (25) are introduced for nondimensionalization. The infinite dilution pressure gradients $Y_1=0$ and $Y_2=0$ hold for the equations (24) and (25) at a temperature T=0 (X=0). Since $p_{1s} \gg p_{2s}$ holds for an asymmetric system (i.e., a binary system significantly differing in vapor pressures), the equation (26) holds:

[Formula 26]
$$X = Y_2 = \frac{p_{1s}}{P_{c1}} \quad (26)$$

Since $(\partial P/\partial x_1)|_{x_1=1} < 0$ holds for a symmetric system that forms minimum boiling azeotropes, the equation (27) holds:

[Formula 27]
$$Y_2 < 0 \quad (27)$$

Highly accurately converged X vs. $Y_1$ and X vs. $Y_2$ relationships will be shown later using data. In general, the correlation between the index X of proximity ratio to critical points and the infinite dilution pressure gradients $Y_1$ and $Y_2$ is expressed in a graph with X plotted on the abscissa against $Y_1$ or $Y_2$ on the ordinate. However, the correlation therebetween may be expressed in a graph with $Y_1$ or $Y_2$ plotted on the abscissa against X on the ordinate.

As shown in the equations (12) and (13), non-ideality in the vapor phase in the high-pressure VLE system is expressed in terms of fugacity coefficients. Recently, a promising method for describing VLE relationship by lumping non-ideality parameters for the liquid and vapor phases (i.e., representing non-ideality in the liquid and vapor phases using one binary parameter) has been proposed (Non-patent Document 4). This lumped non-ideality correlation uses an activity coefficient $\gamma_i$ defined as follows:

[Formula 28]
$$\gamma_i = \frac{\gamma_i^{(Pa)} \exp\frac{v_{iL}(P - Pa)}{RT} \exp\frac{v_i^o(P - p_{is})}{RT}}{\phi_{iV}} \quad (28)$$

Specifically, the liquid-phase non-ideality parameter on the right side of the equation (13) is divided by the vapor-phase non-ideality parameter on the left side thereof for lumping. In this lumped correlation, $\gamma_i$ defined by the equation (28) is free from pressure dependence even for high-pressure phase equilibrium data. Thus, this value is calculated according to the equation (4) or (5). Specifically, the equation (2) or (3) is directly applied even to high-pressure data. Since $\phi_{iV}=1$ holds for low-pressure VLE data, this method is frequently used. In fact, this method was applied to more than 12500 binary VLE data sets included in Non-patent Document 1, to determine binary parameters A and B. Interestingly, it has been demonstrated on the basis of high-pressure VLE data for the argon-oxygen, carbon dioxide-ethane, carbon dioxide-decane, and carbon dioxide-methanol systems that P-x relationships can be correlated favorably even for high-pressure data with $T<T_{c1}$ ($T_{c1}$ represents the critical temperature of component 1) (Non-patent Document 4). In the present invention, the generalization of this lumped correlation will be shown later on the basis of data.

In the present invention, preferably, X vs. $Y_1$ and X vs. $Y_2$ correlations are obtained by incorporating the reliability of data. Specifically, the correlations are determined by confirming that data satisfies the thermodynamic consistency line within a predetermined error range (e.g., within 1%) (data consistency). In this case, errors can be evaluated using H in the following equation (29):

[Formula 29]
$$H = \left|\frac{\beta_{exp} - \beta_{cal}}{\beta_{cal}}\right| \quad (29)$$

wherein $\beta_{exp}$ represents a value of $\beta$ that is calculated according to F/|B−A| using F, A, and B determined from actually measured values, and $\beta_{cal}$ represents a value of $\beta$ that is calculated from the right side in the equation (14) using values of a and b obtained by correlation of actually measured values. For detailed information, see Patent Documents 1 and 2 and Non-patent Document 4. In this context, Patent Documents 1 and 2 show examples using a pressure P, in addition to the use of the equation (15) as an equation that defines F. The step of defining F using a pressure P includes a calculation process for optimization according to the one-parameter Margules equations (17) and (18) in the determination of the value of F, and thus requires more complicated calculation than the step of defining F using the vapor-phase mole fraction of component 1 according to the equation (15). Thus, the present invention employs the step of defining F using the equation (15) since the step is simple and clear. Further, the cumulative frequency distribution of the number of binary systems for the value of H is shown in Non-patent Document 4 and is helpful in the selection of the value of H.

Preferably, the correlation of X with $Y_1$ and $Y_2$ is performed according to the following procedures (i) to (v):
(i) Collection of literature data;
(ii) Determination of binary parameters A and B using an activity coefficient equation most representing phase equilibrium data;
(iii) Determination of a thermodynamic consistency line;
(iv) Determination of X vs. $Y_1$ and X vs. $Y_2$ correlation functions; and
(v) Correlation of X vs. $Y_1$ and X vs. $Y_2$ relationships.

Hereinafter, each of these steps will be described more specifically.

(i) Collection of Literature Data

First, a binary system for obtaining phase equilibrium relationship is identified from components in a compound that is subject to separation or refining. For this binary system, existing vapor-liquid, liquid-liquid, or solid-liquid equilibrium data is collected.

(ii) Determination of Binary Parameters A and B Using an Activity Coefficient Equation For data sets of each binary system, for example, for VLE data sets, binary parameters A and B are determined using the Margules equations (4) and (5) which most represent constant-temperature P-x data and constant-pressure T-x data. In this case, A and B can also be determined using constant-temperature P-x-y data and constant-pressure T-x-y data as well as x-y data. In general, constant-temperature P-x data and constant-pressure T-x data are regarded as being highly accurate (Non-patent Document 3) and as such, are preferably used. Alternatively, other activity coefficient equations, such as the UNIQUAC, Wilson, NRTL, van Laar, and Wohl equations, can be used instead of the Margules equation. When the UNIQUAC equation is used as an activity coefficient equation, a binary parameter $\tau_{ij}$ (consisting of $\tau_{12}$ and $\tau_{21}$) is determined according to the equation (38). When the Wilson equation is used, binary parameters $\Lambda_{12}$ and $\Lambda_{21}$ are determined according to the equations (36) and (37). In this case, the binary parameters may be converted to infinite dilution activity coefficients to determine the values of A and B. For example, when the UNIQUAC equation is used, a binary parameter $\tau_{ij}$ (consisting of $\tau_{12}$ and $\tau_{21}$) can be used to determine an infinite dilution activity coefficient according to the equation (42), thereby determining binary parameters A and B according to the equations (6) and (7). Important is to use an activity coefficient equation most representing phase equilibrium data.

(iii) Determination of a Thermodynamic Consistency Line

From the values of A and B, each $\beta$ in the equation (29) is determined according to the equation (14). Then, $\beta$ is plotted against a pressure P or an average vapor pressure $p_{s,ave}$ on a log-log paper to identify data for which a relative difference H according to the equation (29) converges within a predetermined error range (e.g., within 1%), as a highly reliable data, to obtain a thermodynamic consistency line. From the highly reliable data, constants a and b in the equation (14) are defined based on the obtained thermodynamic consistency line. In this context, it is not required to use a thermodynamic consistency line when correlation accuracy described below in (iv) is high.

(iv) Determination of X Vs. $Y_1$ and X vs. $Y_2$ Correlation Functions

Since both X vs. $Y_1$ and X vs. $Y_2$ relationships exhibit high data convergence, function forms well representing them are selected. In this regard, for example, polynomials relating to X can be selected. Specifically, the following equations (30) and (31) hold in relatively many cases:

[Formula 30]

$$Y_1 = s_{10} + s_{11}X + s_{12}X^2 + s_{13}\ln(1+X) \tag{30}$$

[Formula 31]

$$Y_2 = s_{20} + s_{21}X + s_{22}X^2 + s_{23}\ln(1+X) \tag{31}$$

wherein $s_{10}$ to $s_{23}$ represent correlation constants. In the case of a small number of data points, the number of terms can be decreased in the equations (30) and (31). Also, $s_{10}$ and $s_{20}$ may be excluded in a low-temperature region in order to satisfy the thermodynamic requirements of $Y_1 \to 0$ and $Y_2 \to 0$ in $X \to 0$. Alternatively, correlation based on logarithmic functions of the following equations can be used in many cases:

[Formula 32]

$$Y_1 = s_{11}X^{s_{12}} \tag{32}$$

[Formula 33]

$$Y_2 = s_{21}X^{s_{22}} \tag{33}$$

To improve correlation accuracy in the determination of these correlation functions, when $Y_1$ or $Y_2$ has a negative value (azeotropes are formed), these correlation functions are preferably determined with the values of $Y_1$ and $Y_2$ that are accompanied with negative signs.

(v) Correlation of X Vs. $Y_1$ and X Vs. $Y_2$ Relationships

Reliable data and, by extension, correlation functions are selected in consideration of data consistency based on the thermodynamic consistency line. Then, X vs. $Y_1$ and X vs. $Y_2$ relationships are individually correlated. Alternatively, X vs. $Y_1$ and X vs. $Y_2$ relationships and P vs. $\beta$ relationships may be optimized simultaneously, including the thermodynamic consistency line. Specifically, correlation constants ($s_{01}$ to $s_{23}$) can be determined to achieve the minimum absolute value of the difference between $Y_1$, $Y_2$, and $\beta$ determined from actually measured values and the corresponding values determined according to the correlation equation. From these X vs. $Y_1$ and X vs. $Y_2$ correlations, one set of infinite dilution activity coefficients (or binary parameters A and B) is determined according to the equations (24) and (25).

Specifically, the present invention also relates to a method for prediction of binary phase equilibrium data, comprising newly calculating binary phase equilibrium data (or experimental error-free phase equilibrium relationship) using the values of the infinite dilution activity coefficients $\gamma_1^\infty$ and $\gamma_2^\infty$ or binary parameters A and B calculated by the method for correlation of binary phase equilibrium data of the present invention.

As described above, in the present invention, the converged X vs. $Y_1$ and X vs. $Y_2$ relationships can be correlated by the procedures (i) to (v). Phase equilibrium can be predicted using one set of infinite dilution activity coefficients (or binary parameters A and B) obtained on the basis of this correlation. The new phase equilibrium data this obtained can be used in the design of a component separator or refiner (plant) or the control of an existing refining plant to refine various chemicals, petroleum, natural gases, etc. Thus, the design of a refining plant or the control of an existing refining plant can be performed in a more precise manner than conventional methods.

Thus, the present invention provides even a method for designing or controlling a component separator or refiner using the binary phase equilibrium data obtained by the method for prediction of binary phase equilibrium data of the present invention.

Hereinafter, one example will be shown as the procedures of designing or controlling a component separator or refiner using the data obtained by the method for prediction of binary phase equilibrium data.

(vi) Determination of Variables Necessary for Design

Variables necessary for apparatus or operational design are determined from among temperature, pressure, liquid-phase mole fractions, and vapor-phase mole fractions. The obtained values are added to design conditions.

(vii) Determination of Infinite Dilution Activity Coefficients Appropriate for the Design Conditions The correlations determined above in (v) are used to determine the values of infinite dilution activity coefficients (values of A and B) appropriate for the design conditions obtained in (vi).

(viii) Calculation of Phase Equilibrium Relationship

The phase equilibrium relationship (temperature, pressure, and mole fractions in each phase) is calculated using the equation (1) on the basis of the design conditions and the infinite dilution activity coefficients. Preferably, the activity coefficient equation used in the parameter determination of (ii) is used as this activity coefficient equation.

(ix) Calculation of Phase Equilibrium Relationship Using the Homologous Series Method for a System on which Phase Equilibrium Data has not been Found Although the phase equilibrium relationship is necessary, its data may not be found. In such a case, the procedures (i) to (vii) are repeated for homologous series to determine infinite dilution activity coefficients or binary parameters A and B for the homologous series. For example, when reliable vapor-liquid equilibrium data cannot be found for the pentanol (1)-water (2) system, infinite dilution activity coefficients are determined for the alkanol (1)-water (2) systems using existing data on the methanol-water system, the ethanol-water system, . . . , the octanol-water system. These values are plotted against the number of carbon atoms in alkanols or the molecular surface areas of alkanols. The infinite dilution activity coefficients for the pentanol (1)-water (2) system are determined by interpolation or extrapolation. Subsequently, the phase equilibrium relationship is calculated according to the step (viii).

The phase equilibrium relationship in the steps (viii) and (ix) encompasses: VLE relationships such as (a) P-x relationships, (b) P-y relationships, (c) x-y relationships, (d) y/x distribution ratios, and (e) azeotropic points; and LLE relationships such as (f) mutual solubility and (g) liquid-liquid distribution ratios.

Preferably, the equation (22) is used as an independent variable X for the selection of correlation functions in the step (iv). Alternatively, vapor pressures $p_{1s}+p_{2s}$, or $p_{1s}$ for the nearly asymmetric system, or hypothetical vapor pressure (e.g., a fixed multiple of $p_{1s}$) may be used instead of X. Specifically, for the abscissa according to the present invention, it is absolutely necessary to select the sum $p_{1s}+p_{2s}$ of vapor pressures or an average vapor pressure $p_{s,ave}$. Also preferably, the equations (24) and (25) are used for $Y_1$ and $Y_2$, respectively. Alternatively, the denominator introduced for the nondimensionalization of infinite dilution pressure gradients may be removed, or nondimensionalization may be performed in a manner different from the equations (24) and (25). Also, non-ideality parameters different from the equation (28) may be defined to determine infinite dilution pressure gradients. In order to obtain the correlations, the abscissa and the ordinate may be exchanged therebetween for data correlation, as described above.

In these procedures (i) to (ix), data calculation can be performed using a computer. This computational calculation is carried out, for example, by a method comprising the steps of: recording existing binary phase equilibrium data input to a computer through an information input unit, on a phase equilibrium information recording unit in the computer; calculating an index X of proximity ratio to critical points and infinite dilution pressure gradients $Y_1$ and $Y_2$ by means of a phase equilibrium correlation unit in the computer on the basis of the binary phase equilibrium data output from the phase equilibrium information recording unit, and correlating the obtained index X of proximity ratio to critical points with the infinite dilution pressure gradients $Y_1$ and $Y_2$ to calculate infinite dilution activity coefficients $\gamma_1^\infty$ and $\gamma_2^\infty$ or binary parameters A and B from the X-$Y_1$ correlation and the X-$Y_2$ correlation, respectively; inputting the thus-obtained infinite dilution activity coefficients $\gamma_1^\infty$ and $\gamma_2^\infty$ or binary parameters A and B to a phase equilibrium prediction unit in the computer to newly predict binary phase equilibrium data; and inputting the calculated new binary phase equilibrium data to a component separator/refiner design/control unit to design or control the component separator or refiner.

In this method, one set of infinite dilution activity coefficients (or binary parameters A and B) is calculated by means of the phase equilibrium correlation unit. Preferably, in the step of defining X, $Y_1$, and $Y_2$, the equation (22) is used for calculating X while the equations (24) and (25) are used for calculating $Y_1$ and $Y_2$. Preferably, before inputting the phase equilibrium information to the phase equilibrium correlation unit, the method further comprises the step of inputting the information output from the phase equilibrium information recording unit to a thermodynamic consistency assessment/output unit to assess thermodynamic consistency, preferably, according to the equation (29), and then inputting only the thermodynamically consistent information to the phase equilibrium correlation unit. In order to cope with the system on which existing phase equilibrium data has not been found as in the step (ix), also preferably, the method further comprises the step of predicting an index X of proximity ratio to critical points and infinite dilution pressure gradients $Y_1$ and $Y_2$ for homologous series of the system of interest from phase equilibrium information derived from a plurality of systems of homologous series, and inputting these data to a homologous-series phase equilibrium value prediction unit to predict phase equilibrium values for the system of interest.

The thus-obtained prediction information is inputted to a design/control unit for a component separator or refiner such as a distillation column, an extraction column, or a crystallizer, i.e., a refining plant, to calculate component separator/refiner design or control information. If necessary, the component separator or refiner is designed or controlled on the basis of this information. In this case, variables necessary for design or control are determined, as described above in (vi), and design conditions including these values are input in advance to the component separator/refiner design/control unit.

Also, phase equilibrium can be predicted by the same operation as in the conventional group contribution method using the values of infinite dilution activity coefficients (or binary parameters A and B) obtained by the correlation method and the method for prediction of phase equilibrium of the present invention. The data obtained by the method of the present invention contains the values of A and B more accurate than numeric values used in calculation according to the conventional group contribution method. Thus, the method of the present invention can produce data more highly accurate than that in the conventional group contribution method. Thus, in the calculation method described above, also preferably, the calculation of design or control information is further provided with the step of inputting the data to a group contribution method calculation unit to calculate infinite dilution activity coefficients (or binary parameters A and B) for atomic groups involved in the group contribution method. The thus-calculated information of infinite dilution activity coefficients (or binary parameters A and B) for atomic groups is input to the component separator/refiner design/control unit to design or control the component separator or refiner. The group contribution method permits convenient calculation of the component separator/refiner design or control information and as such, is often utilized for the conventional rough calculation in the component separator/refiner (e.g., distillation column, extraction column, or crystallizer) design/control unit. Thus, such a method is also recommended for the present invention. As a matter of course, the calculation of design or control information is not limited thereto.

The apparatus for designing or controlling a component separator or refiner such as a distillation column, an extraction column, or a crystallizer comprises: (1) a phase equilibrium information recording unit which receives existing binary phase equilibrium data input to a computer through an information input unit; (2) a phase equilibrium correlation unit which calculates an index X of proximity ratio to critical points and infinite dilution pressure gradients $Y_1$ and $Y_2$ on the basis of the binary phase equilibrium data output from the phase equilibrium information recording unit, and correlates the obtained index X of proximity ratio to critical points with the infinite dilution pressure gradients $Y_1$ and $Y_2$ to calculate infinite dilution activity coefficients $\gamma_1^\infty$ and $\gamma_2^\infty$ or binary parameters A and B from the $X$-$Y_1$ correlation and the $X$-$Y_2$ correlation, respectively; (3) a phase equilibrium prediction unit which receives the input of the infinite dilution activity coefficients $\gamma_1^\infty$ and $\gamma_7^\infty$ or binary parameters A and B output from the phase equilibrium correlation unit to newly predict binary phase equilibrium data; (4) a component separator/refiner design/control information calculation unit which receives the input of the calculated new binary phase equilibrium data output from the phase equilibrium prediction unit to calculate component separator/refiner design or control information; and (5) a component separator/refiner design/control unit which designs or controls the component separator or the refiner on the basis of the information calculated through the component separator/refiner design/control information calculation unit. The apparatus for designing or controlling a component separator or refiner may be provided, if necessary, with a data output apparatus such as a printer or a liquid crystal display. In this apparatus, a networked remote computer may be used as the computer.

The present invention further provides even a program for designing or controlling a component separator or refiner such as a distillation column, an extraction column, or a crystallizer, the program executing the method or apparatus for designing or controlling a component separator or refiner such as a distillation column, an extraction column, or a crystallizer. This program may be recorded, if necessary, on an appropriate recording medium such as CD or USB.

In addition, multicomponent data can be obtained using the binary data obtained by the correlation method and the method for prediction of phase equilibrium of the present invention.

The embodiments of the present invention are summarized as follows:

[1] A method for correlating or predicting binary phase equilibrium data, comprising:

calculating an index X of proximity ratio to critical points and infinite dilution pressure gradients $Y_1$ and $Y_2$ using binary phase equilibrium measurement data;

correlating the obtained index X of proximity ratio to critical points with the infinite dilution pressure gradients $Y_1$ and $Y_2$ and calculating infinite dilution activity coefficients $\gamma_1^\infty$ and $\gamma_2^\infty$ or binary parameters A and B from the $X$-$Y_1$ correlation and the $X$-$Y_2$ correlation, respectively; and predicting new binary phase equilibrium data using the calculated values of the infinite dilution activity coefficients $\gamma_1^\infty$ and $\gamma_2^\infty$ or binary parameters A and B.

[2] The method for correlating or predicting binary phase equilibrium data according to [1] above, wherein the index X of proximity ratio to critical points is calculated according to the equation (22):

[Formula 34]

$$X = \frac{p_{1s} + p_{2s}}{P_{c1} + p_{2s}} \qquad (22)$$

wherein $P_{c1}$ represents the critical pressure of a lighter component in the binary system; and $p_{1s}$ and $p_{2s}$ represent the vapor pressures of components 1 and 2, respectively, at a temperature T, and the infinite dilution pressure gradients $Y_1$ and $Y_2$ are calculated according to the equation (24):

[Formula 35]

$$Y_1 = \frac{\gamma_1^\infty p_{1s} - p_{2s}}{P_{c1} - p_{2s}} \qquad (24)$$

and the equation (25):

[Formula 36]

$$Y_2 = \frac{p_{1s} - \gamma_2^\infty p_{2s}}{P_{c1} - p_{2s}} \qquad (25)$$

wherein $\gamma_i^\infty$ represents the infinite dilution activity coefficient of component i in the liquid phase; and $P_{c1}$, $p_{1s}$, and $p_{2s}$ are as defined in the equation (22).

[3] The method for correlating or predicting binary phase equilibrium data according to [1] above, further comprising evaluating the thermodynamic consistency of the $X$-$Y_1$ and $X$-$Y_2$ correlation data according to the following equation (29), and correlating X with $Y_1$ and $Y_2$ using only thermodynamically consistent data:

[Formula 37]

$$H = \left| \frac{\beta_{exp} - \beta_{cal}}{\beta_{cal}} \right| \qquad (29)$$

wherein $\beta_{exp}$ represents a value of $\beta$ that is calculated according to F/|B−A| using F, A, and B determined from actually measured values; and $\beta_{cal}$ represents a value of $\beta$ that is calculated from the right side in the following equation (14) using values of a and b obtained by correlation of actually measured values:

[Formula 38]

$$\beta = \frac{F}{|B-A|} = aP^b \qquad (14)$$

wherein A and B represent binary parameters; F represents deviation from A=B in the one-parameter Margules equation; P represents a pressure or an average vapor pressure; and a and b represent constants specific for the binary system.

[4] A method for designing or controlling a component separator or a refiner, comprising the steps of:
recording existing binary phase equilibrium data;
implementing the method for correlating or predicting binary phase equilibrium data according to [1] above; and
inputting the calculated new binary phase equilibrium data to a component separator/refiner design/control unit to design or control the component separator or the refiner.

[5] The method for designing or controlling a component separator or refiner according to [4] above, wherein the index X of proximity ratio to critical points is calculated according to the equation (22):

[Formula 39]

$$X = \frac{p_{1s} + p_{2s}}{P_{c1} + p_{2s}} \qquad (22)$$

wherein $P_{c1}$ represents the critical pressure of a lighter component in the binary system; and $p_{1s}$ and $p_{2s}$ represent the vapor pressures of components 1 and 2, respectively, at a temperature T, and the infinite dilution pressure gradients $Y_1$ and $Y_2$ are calculated according to the equation (24):

[Formula 40]

$$Y_1 = \frac{\gamma_1^\infty p_{1s} - p_{2s}}{P_{c1} - p_{2s}} \qquad (24)$$

and the equation (25):

[Formula 41]

$$Y_2 = \frac{p_{1s} - \gamma_2^\infty p_{2s}}{P_{c1} - p_{2s}} \qquad (25)$$

wherein $\gamma_i^\infty$ represents the infinite dilution activity coefficient of component i in the liquid phase; and $P_{c1}$, $p_{1s}$, and $p_{2s}$ are as defined in the equation (22).

[6] The method for designing or controlling a component separator or refiner according to [4] above, further comprising evaluating the thermodynamic consistency of the X-$Y_1$ and X-$Y_2$ correlation data according to the following equation (29), and correlating X with $Y_1$ and $Y_2$ using only thermodynamically consistent data:

[Formula 42]

$$H = \left|\frac{\beta_{exp} - \beta_{cal}}{\beta_{cal}}\right| \qquad (29)$$

wherein $\beta_{exp}$ represents a value of $\beta$ that is calculated according to F/|B−A| using F, A, and B determined from actually measured values; and $\beta_{cal}$ represents a value off $\beta$ that is calculated from the right side in the following equation (14) using values of a and b obtained by correlation of actually measured values:

[Formula 43]

$$\beta = \frac{F}{|B-A|} = aP^b \qquad (14)$$

wherein A and B represent binary parameters; F represents deviation from A=B in the one-parameter Margules equation; P represents a pressure or an average vapor pressure; and a and b represent constants specific for the binary system.

[7] The method for designing or controlling a component separator or refiner according to [4] above, wherein the infinite dilution activity coefficients $\gamma_1^\infty$ and $\gamma_2^\infty$ or the binary parameters A and B are data from a plurality of systems of homologous series, and infinite dilution activity coefficients $\gamma_1^\infty$ and $\gamma_2^\infty$ or binary parameters A and B in other systems of homologous series are predicted from the data from a plurality of systems of homologous series.

[8] The method for designing or controlling a component separator or refiner according to [4] above, further comprising calculating infinite dilution activity coefficients, or binary parameters for atomic groups from the calculated infinite dilution activity coefficients $\gamma_1^\infty$ and $\gamma_2^\infty$ or binary parameters A and B, and predicting new binary phase equilibrium data based on the calculated infinite dilution activity coefficients or binary parameters for atomic groups.

[9] A program for designing or controlling a component separator or a refiner, the program allowing a computer having an arithmetic processing unit and a data storage unit or a networked computer having an arithmetic processing unit and a data storage unit to function to implement the method for designing or controlling a component separator or refiner according to [4] above, the method comprising the steps of:
storing existing binary phase equilibrium data on the data storage unit;
outputting the binary phase equilibrium data from the data storage unit to the arithmetic processing unit and a predetermined arithmetic expression stored on the data storage unit in advance, substituting the binary phase equilibrium data into the arithmetic expression by means of the arithmetic processing unit to calculate an index X of proximity ratio to critical points and infinite dilution pressure gradients $Y_1$ and $Y_2$, correlating the obtained index X of proximity ratio to critical points with the infinite dilution pressure gradients $Y_1$ and $Y_2$, and calculating infinite dilution activity coefficients $\gamma_1^\infty$ and $\gamma_2^\infty$ or binary parameters A and B from the X-$Y_1$ correlation and the X-$Y_2$ correlation, respectively;
processing the infinite dilution activity coefficients $\gamma_1^\infty$ and $\gamma_2^\infty$ or the binary parameters A and B to predict new binary phase equilibrium data; and calculating information for designing or controlling the component separator or the refiner from the new binary phase equilibrium data.

[10] An apparatus for designing or controlling a component separator or a refiner, comprising:

a phase equilibrium information recording unit which receives existing binary phase equilibrium data input to a computer through an information input unit;

a phase equilibrium correlation unit which calculates an index X of proximity ratio to critical points and infinite dilution pressure gradients $Y_1$ and $Y_2$ on the basis of the binary phase equilibrium data output from the phase equilibrium information recording unit, and correlates the obtained index X of proximity ratio to critical points with the infinite dilution pressure gradients $Y_1$ and $Y_2$ to calculate infinite dilution activity coefficients $\gamma_1^\infty$ and $\gamma_2^\infty$ or binary parameters A and B from the X-$Y_1$ correlation and the X-$Y_2$ correlation, respectively;

a phase equilibrium prediction unit which receives the input of the infinite dilution activity coefficients $\gamma_1^\infty$ and $\gamma_2^\infty$ or binary parameters A and B output from the phase equilibrium correlation unit to predict new binary phase equilibrium data;

a component separator/refiner design/control information calculation unit which receives the input of the new binary phase equilibrium data output from the phase equilibrium prediction unit to calculate component separator/refiner design/control information; and a component separator/refiner design/control unit which designs or controls the component separator or the refiner on the basis of the information calculated through the component separator/refiner design/control information calculation unit.

[11] The apparatus for designing or controlling a component separator or a refiner according to [10] above, wherein the index X of proximity ratio to critical points is calculated according to the equation (22):

[Formula 44]

$$X = \frac{p_{1s} + p_{2s}}{P_{c1} + p_{2s}} \quad (22)$$

wherein $P_{c1}$ represents the critical pressure of a lighter component in the binary system; and $p_{1s}$ and $p_{2s}$ represent the vapor pressures of components 1 and 2, respectively, at a temperature T, and the infinite dilution pressure gradients $Y_1$ and $Y_2$ are calculated according to the equation (24):

[Formula 45]

$$Y_1 = \frac{\gamma_1^\infty p_{1s} - p_{2s}}{P_{c1} - p_{2s}} \quad (24)$$

and the equation (25):

[Formula 46]

$$Y_2 = \frac{p_{1s} - \gamma_2^\infty p_{2s}}{P_{c1} - p_{2s}} \quad (25)$$

wherein $\gamma_i^\infty$ represents the infinite dilution activity coefficient of component i in the liquid phase; and $P_{c1}$, $p_{1s}$, and $p_{2s}$ are as defined in the equation (22).

[12] The apparatus for designing or controlling a component separator or refiner according to [10] above, further comprising evaluating the thermodynamic consistency of the X-$Y_1$ and X-$Y_2$ correlation data according to the following equation (29), and correlating X with $Y_1$ and $Y_2$ using only thermodynamically consistent data:

[Formula 47]

$$H = \left| \frac{\beta_{exp} - \beta_{cal}}{\beta_{cal}} \right| \quad (29)$$

wherein $\beta_{exp}$ represents a value of $\beta$ that is calculated according to F/|B−A| using F, A, and B determined from actually measured values; and $\beta_{cal}$ represents a value of $\beta$ that is calculated from the right side in the following equation (14) using values of a and b obtained by correlation of actually measured values:

[Formula 48]

$$\beta = \frac{F}{|B - A|} = aP^b \quad (14)$$

wherein A and B represent binary parameters; F represents deviation from A=B in the one-parameter Margules equation; P represents a pressure or an average vapor pressure; and a and b represent constants specific for the binary system.

[13] The apparatus for designing or controlling a component separator or refiner according to [10] above, wherein the infinite dilution activity coefficients $\gamma_1^\infty$ and $\gamma_2^\infty$ or binary parameters A and B calculated through the phase equilibrium correlation unit are data from a plurality of systems of homologous series, and infinite dilution activity coefficients $\gamma_1^\infty$ and $\gamma_2^\infty$ or binary parameters A and B in other systems of homologous series are predicted from the data from a plurality of systems of homologous series.

[14] The apparatus for designing or controlling a component separator or refiner according to [10] above, wherein the phase equilibrium correlation unit calculates infinite dilution activity coefficients or binary parameters for atomic groups from the calculated infinite dilution activity coefficients $\gamma_1^\infty$ and $\gamma_2^\infty$ or binary parameters A and B, and the phase equilibrium prediction unit receives the input of the calculated infinite dilution activity coefficients or binary parameters for atomic groups.

Advantageous Effects of Invention

The present invention has achieved the highly accurate correlation of phase equilibrium data by use of relationships between infinite dilution pressure gradients and vapor pressures in the binary system and thereby enabled one set of infinite dilution activity coefficients (or binary parameters A and B) to be precisely calculated. As a result, phase equilibrium relationship can be predicted in a highly accurate manner that has not been achieved by conventional methods. Thus, binary phase equilibrium relationship can be determined precisely from existing data and can be used to precisely design or control a component separator or refiner such as a distillation column, an extraction column, or a crystallizer. This apparatus design neither requires further experimentally obtaining or validating binary phase equilibrium data nor has to be performed in expectation of safety factors larger than necessary. Thus, an apparatus that can be operated inexpensively in a simple process can be designed, i.e., an economically excellent apparatus can be designed. In addition, an existing apparatus can be controlled on the basis of phase equilibrium data more precise than that at the time of its design. As a result, component separation or refining for chemicals, petroleum, or natural gases can be carried out more precisely under inexpensive operational conditions by, for example, the correction of existing data. Also, the present invention produces precise phase equilibrium data and thus has the advantage that apparatus design procedures can be simplified more than ever before. The precise phase equilibrium data thus obtained can contribute to the improvement of solution models representing non-ideality in the liquid phase, such as activity coefficient equations or group contribution methods. Thus, the present invention can make a significant contribution to industry.

BRIEF DESCRIPTION OF DRAWINGS

FIG. 4 is a diagram for illustrating the highly accurate method for correlation of phase equilibrium data of the present invention using relationships between infinite dilution pressure gradients and vapor pressures for the methanol (1)-water (2) system, wherein

FIG. 5 is a diagram showing constant-temperature or constant-pressure P-x and P-y relationships for the methanol (1)-water (2) system derived from the results of FIGS. 4(b) to 4(e), wherein

FIG. 6 is a diagram showing X vs. Y relationships for the heptane (1)-octane (2) system, wherein

FIG. 7 is a diagram for illustrating the highly accurate method for correlation of phase equilibrium data of the present invention using relationships between infinite dilution pressure gradients and vapor pressures for the 1-propanol (1)-water (2) system, wherein

FIG. 8 is a diagram for illustrating the highly accurate method for correlation of phase equilibrium data of the present invention using relationships between infinite dilution pressure gradients and vapor pressures for the acetone (1)-chloroform (2) system, wherein

FIG. 9 is a diagram for illustrating the highly accurate method for correlation of phase equilibrium data of the present invention using relationships between infinite dilution pressure gradients and vapor pressures for the 1-butanol (1)-water (2) system, wherein

FIG. 14 is a diagram showing relationships between the composition of an azeotrope and temperature, wherein

FIG. 15 is a diagram showing that $Y_1$ and $Y_2$ can be predicted by the homologous series method, wherein

FIG. 17 is a table showing 60 constant-temperature or constant-pressure data sets for the methanol (1)-water (2) system (the data is cited from Non-patent Document 1);

FIG. 18 is a table showing VLE data for the heptane (1)-octane (2) system (the data is cited from Non-patent Document 1);

FIG. 19 is a table showing VLE data for the 1-propanol (1)-water (2) system (the data is cited from Non-patent Document 1);

FIG. 20 is a table showing VLE data for the acetone (1)-chloroform (2) system (the data is cited from Non-patent Document 1);

FIG. 21 is a table showing LLE data for the 1-butanol (1)-water (2) system (the data is cited from Non-patent Document 2);

FIG. 22 is a table showing LLE data for the 2-butanone (1)-water (2) system (the data is cited from Non-patent Document 2); and FIG. 23 is a table showing constant-temperature VLE data for the carbon dioxide (1)-ethane (2) system (the data is cited from Non-patent Document 6).

DESCRIPTION OF EMBODIMENTS

Hereinafter, the method for correlation of binary phase equilibrium data, the method for prediction of binary phase equilibrium data, and the method and apparatus for designing or controlling a component separator or refiner according to the present invention will be described more specifically.

First, the highly accurate method for correlation of phase equilibrium data of the present invention using relationships between infinite dilution pressure gradients and vapor pressures, and the method for prediction of binary phase equilibrium data based on the correlation results will be described specifically.

[Correlation of Low-Pressure VLE Data]

(i) Methanol (1)-Water (2) System

Figure 4A:
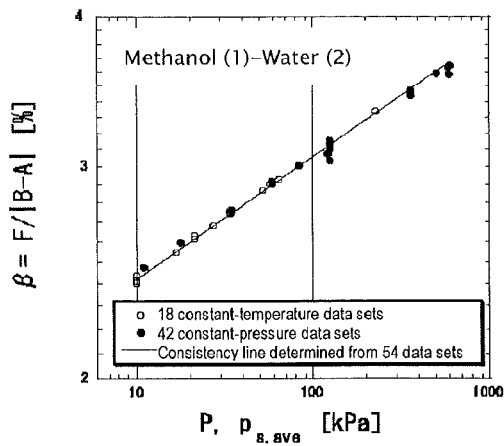
FIG. 4(a) is a diagram showing a thermodynamic consistency line for the methanol (1)-water (2) system.

FIG. 4(a) shows a thermodynamic consistency line for the methanol (1)-water (2) system as a typical nonazeotropic system. The binary VLE data is cited from Non-patent Document 1. The values of vapor pressures in the analyses shown below are cited from Non-patent Document 1. In the drawing, the open circle (○) denotes constant-temperature data, and the filled circle (●) denotes constant-pressure data. The values of the critical pressure $P_{c1}$ of the lighter component (methanol) are cited from Non-patent Document 3. FIG. 4(a) shows that: (i) data converges to the line; (ii) data convergence is high; and (iii) constant-temperature data and constant-pressure data converge to the same line. The tolerance of data reliability was set to 1%, and data deviated by 1% or more from the correlation line was excluded. As a result, 54 out of 60 data sets fell in the error range of 1%. A thermodynamic consistency line determined from these 54 reliable data sets is shown in a linear form in FIG. 4(a). The 60 constant-temperature or constant-pressure data sets are shown in the table of FIG. 17.

Figure 4B:
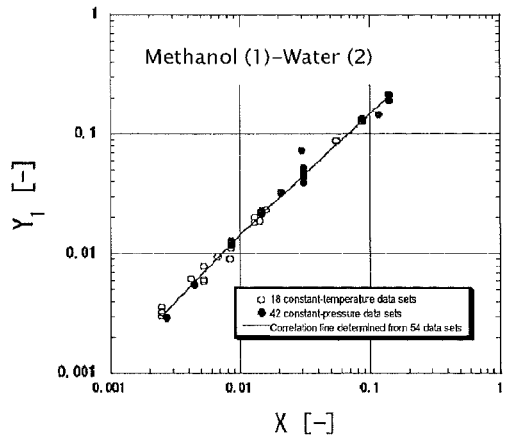
FIG. 4(b) is a diagram showing X vs. $Y_1$ relationships for the methanol (1)-water (2) system.

FIG. 4(b) shows X vs. $Y_1$ relationships for the 60 data sets. The calculation depended on the equations (22), (24) and (25). In the drawing, the open circle (○) denotes constant-temperature data, and the filled circle (●) denotes constant-pressure data. Also, the solid line denotes a correlation line optimized using the equation (30). FIG. 4(b) shows that: (i) the correlation according to the present invention is highly accurate; (ii) constant-temperature data and constant-pressure data converge to the same correlation line; and (iii) this correlation line is slightly inferior in convergence to the thermodynamic consistency line.

In this context, the correlation line optimized using the equation (30) was calculated as follows: first, a thermodynamic consistency line was determined from the 60 data sets shown in FIG. 17, and data deviated by 1% or more therefrom was excluded to select 54 data sets. Next, for these 54 sets, the values of X were calculated according to the equation (22) while the values of $Y_1$ were determined according to the equation (24). In this case, for constant-pressure data, vapor pressures were calculated using the temperature given by the equation (23). The values of infinite dilution activity coefficients were calculated according to $\gamma_1^\infty = \exp(A)$ and $\gamma_2^\infty = \exp(B)$ from A and B given in FIG. 17. Next, correlation constants were determined by the method of least squares using the equations (30) and (32) as X vs. $Y_1$ correlation equations. In the case of FIG. 4B, the equation (30) was superior in correlation accuracy. Specifically, the correlation was achieved according to the equation (34) with 7.6% errors.

[Formula 49]

$$Y_1 = -0.00070 - 0.2573X + 0.63004X^2 + 1.753191n(1+X) \quad (34)$$

In FIG. 4(b), a representative line of the above equation is indicated by the solid line.

Figure 4C:
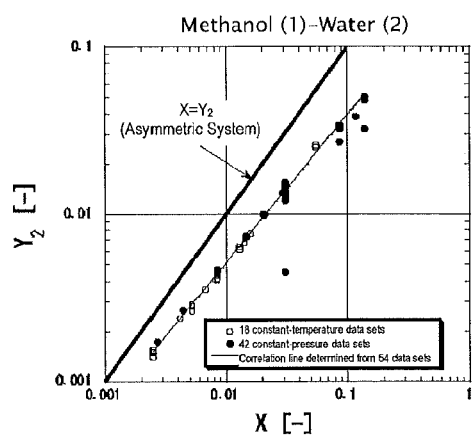
FIG. 4(c) is a diagram showing X vs. $Y_2$ relationships.

FIG. 4(c) shows X vs. $Y_2$ relationships for the 60 data sets. In the drawing, the open circle (○) denotes constant-temperature data, and the filled circle (●) denotes constant-pressure data. Also, the thin solid line denotes a correlation line optimized using the equation (31). The calculation of FIG. 4(c) was also performed in the same way as in FIG. 4(b) using the 60 data sets. In this case, the following correlation equation was obtained:

[Formula 50]

$$Y_2 = 0.2985X^{0.882} \quad (35)$$

FIG. 4(c) shows that: (i) the correlation according to the present invention is highly accurate; (ii) constant-temperature data and constant-pressure data converge to the same correlation line; and (iii) this correlation line is slightly inferior in convergence to the thermodynamic consistency line. In FIG. 4(c), X=$Y_2$ relationships were also indicated by the thick solid line. This demonstrates that the methanol-water system, for which $Y_2$>0 holds, does not form azeotropes, but is not a complete asymmetric system (for which $p_{1s} \gg p_{2s}$ holds). As is evident from FIGS. 4(b) and 4(c), the X vs. $Y_1$ and X vs. $Y_2$ correlations proposed by the present invention are much more highly accurate than the conventional correlation of VLE data shown in FIG. 3. FIGS. 4(b) and 4(c) demonstrate the effectiveness of the present invention for the nonazeotropic system.

Figure 3A:
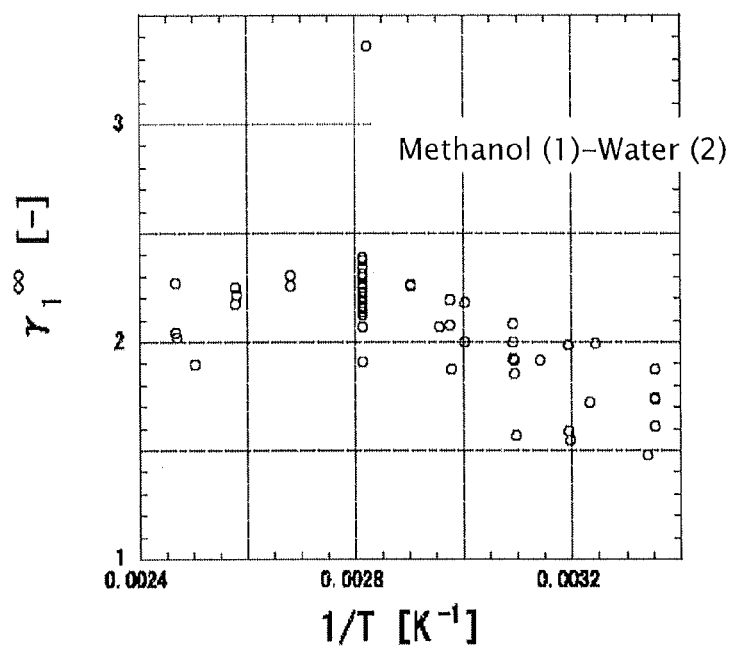
FIG. 3 is a diagram showing the temperature dependence of infinite dilution activity coefficients $\gamma_1^\infty$ (FIG. 3(a)) and $\gamma_2^\infty$ (FIG. 3(b)) for the methanol (1)-water (2) system.
Figure 3B:
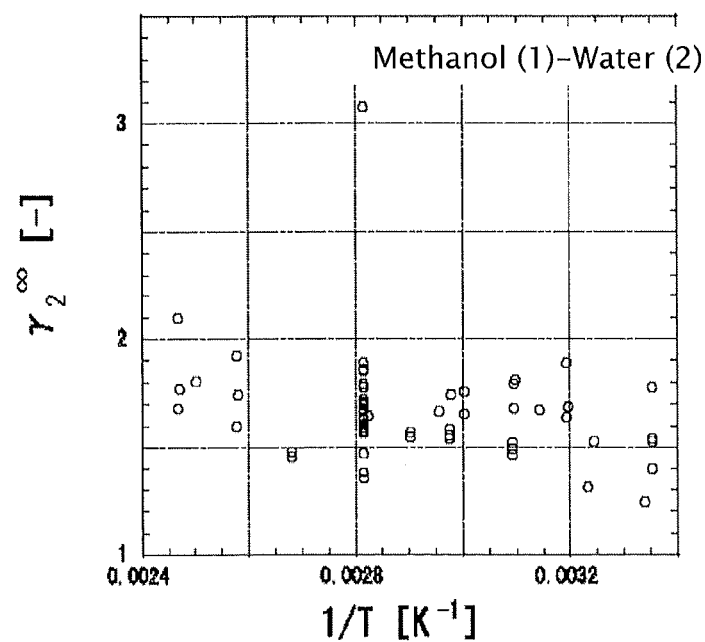
Figure 4D:
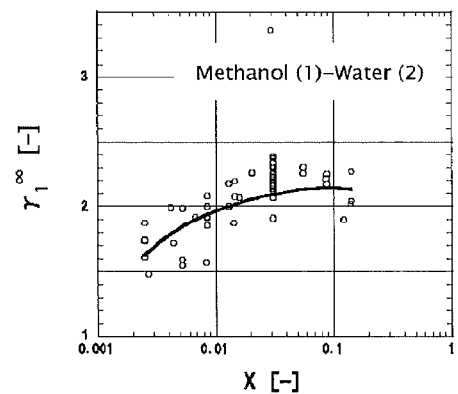
FIG. 4(d) is a diagram showing X vs. $\gamma_1^\infty$ relationships for the methanol (1)-water (2) system.
Figure 4E:
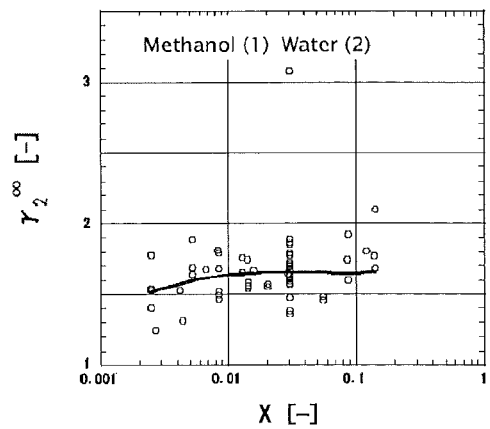
FIG. 4(e) is a diagram showing X vs. $\gamma_2^\infty$ relationships.

FIGS. 4(d) and 4(e) show X vs. $\gamma_1^\infty$ and X vs. $\gamma_2^\infty$ relationships, respectively, for the methanol (1)-water (2) system. X is plotted as a single function of temperature on the abscissa. These data sets are significantly variable, as in FIG. 3. Thus, FIGS. 4(d) and 4(e) show that the conversion of a reciprocal of temperature to X on the abscissa is not enough to converge data sets to the line. Since vapor-liquid equilibrium relationship is proportional to activity coefficients as shown in the equations (2) and (3), variations appearing in FIGS. 3, 4(d) and 4(e) are directly reflected in the VLE relationship. In FIGS. 4(d) and 4(e), the values of $\gamma_1^\infty$ and $\gamma_2^\infty$ determined from the representative lines of FIGS. 4(b) and 4(c) are indicated by the solid line. The calculation was performed as follows: first, X was determined according to the equation (22) from a system temperature, and $Y_1$ and $Y_2$ were calculated according to the equations (34) and (35). Next, $\gamma_1^\infty$ and $\gamma_2^\infty$ were calculated according to the equations (24) and (25). FIGS. 4(d) and 4(e) show that one-to-one relationships of temperature with $\gamma_1^\infty$ and $\gamma_2^\infty$ can be determined by the present invention in an accurate manner that has not been achieved by conventional methods.

Figure 5A:
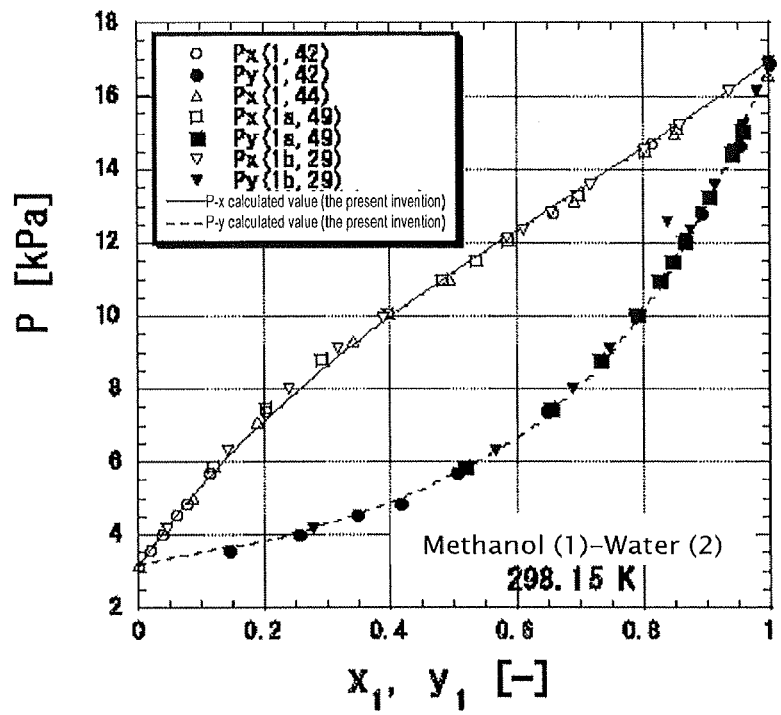
FIG. 5(a) is a diagram showing P-x and P-y relationships for the methanol (1)-water (2) system at a temperature of 298.15 K.

FIG. 5(a) shows P-x and P-y relationship data for the methanol (1)-water (2) system at a temperature of 298.15 K. In the drawing, the open circle (○) denotes Px(1,42), the filled circle (●) denotes Py(1,42), the open triangle (Δ) denotes Px(1,44), the open square (□) denotes Px(1a,49), the filled square (■) denotes Py(1a,49), the open inverted triangle (∇) denotes Px(1b,29), and the filled inverted triangle (▼) denotes Py(1b,29). m of the numeric values in the parentheses (m,n) denotes part number in Non-patent Document 1, and n thereof denotes page number therein. In the drawing, values predicted from the X vs. $Y_1$ relationships (FIG. 4(b)) and X vs. $Y_2$ relationships (FIG. 4(c)) determined by the present invention were indicated by the solid line (P-x calculated value) and the broken line (P-y calculated value), respectively. This prediction was calculated as follows: first, the vapor pressures of methanol and water were determined at 298.15 K based on Non-patent Document 1 ($p_{1s}$=16.93 kPa, $p_{2s}$=3.16 kPa, $P_{c1}$=8090 kPa), and the values were substituted into the equation (22) to determine an index X of proximity ratio to critical points (X=0.00248). Then, $Y_1$ and $Y_2$ were calculated according to the equations (34) and (35) ($Y_1$=0.00301, $Y_2$=0.00150). Next, infinite dilution activity coefficients $\gamma_1^\infty$ and $\gamma_2^\infty$ were determined according to the equations (24) and (25) ($\gamma_1^\infty$=1.439, $\gamma_2^\infty$=1.511). Next, binary parameters A and B were determined according to the equations (6) and (7) (A=0.3639, B=0.4130), and activity coefficients $\gamma_1$ and $\gamma_2$ were determined according to the equations (4) and (5) for arbitrary $x_1$ (for example, when $x_1$=0.5, $\gamma_1$=1.109 and $\gamma_2$=1.095). These values were substituted into the equation (8) to determine a pressure P (P=11.11 kPa). $y_1$ was determined according to the equation (9) ($y_1$=0.844). An activity coefficient was calculated for a liquid composition different from $x_1$=0.5, a pressure P was determined, the procedure to determine $y_1$ was repeated, and plots were prepared to obtain the curves of the calculated P-x values and calculated P-y values as shown in FIG. 5(a). As is evident from FIG. 5(a), the calculated values are in exceedingly good agreement with the measurement values shown in the document.

Figure 5B:
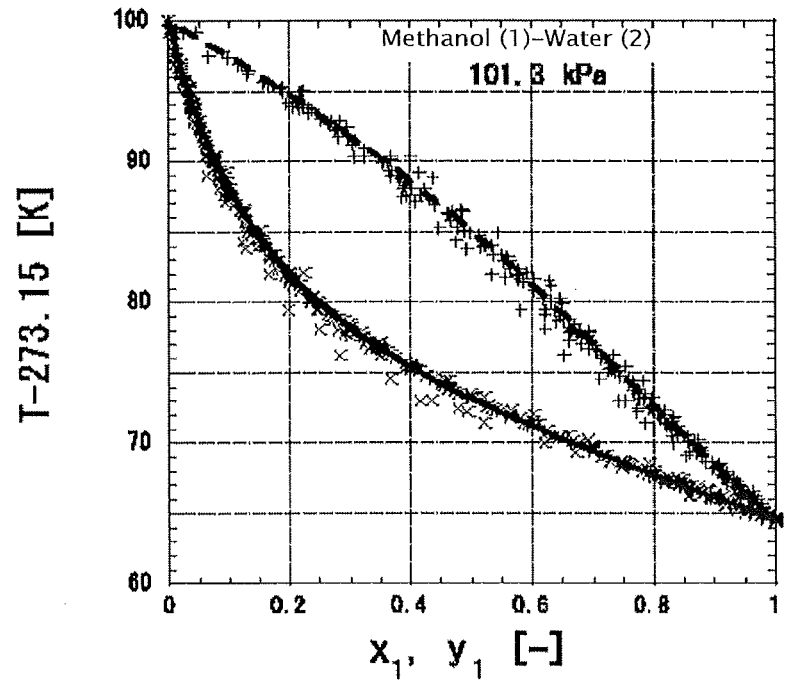
FIG. 5(b) is a diagram showing T-x and T-y relationships for the methanol (1)-water (2) system at 101.3 kPa.

FIG. 5(b) shows T-x and T-y relationships for the methanol (1)-water (2) system at 101.3 kPa. In FIG. 5(b), x denotes the relationship of $x_1$ and T−273.15 for actually measured values, and + denotes the relationship of $y_1$ and T−273.15 for actually measured values. P-x and P-y values predicted from the X vs. $Y_1$ and X vs. $Y_2$ relationships determined by the present invention are indicated by the solid line and the broken line, respectively. This prediction was performed as follows: first, the boiling points of methanol and water were determined at 101.3 kPa ($t_{b1}$=64.55° C., $t_{b2}$=100.00° C.), and an average boiling point was determined according to the equation (23) ($t_{b,ave}$=82.27° C.). Vapor pressures were determined at the average boiling point ($p_{1s}$=195.82 kPa, $p_{2s}$=51.78 kPa). The value of an index X of proximity ratio to critical points was determined using the average boiling point (X=0.0304). Then, $Y_1$ and $Y_2$ were calculated according to the equations (34) and (35) ($Y_1$=0.0446, $Y_2$=0.01371). Next, infinite dilution activity coefficients $\gamma_1^\infty$ and $\gamma_2^\infty$ were determined according to the equations (24) and (25) ($\gamma_1^\infty$=1.842, $\gamma_2^\infty$=1.654). Next, binary parameters A and B were determined according to the equations (6) and (7) (A=0.6107, B=0.5029), and activity coefficients were determined according to the equations (4) and (5) for arbitrary $x_1$ (for example, when $x_1$=0.5, $\gamma_1$=1.134 and $\gamma_2$=1.165). These values were substituted into the equation (8) (P=101.3 kPa) to determine a system temperature T that satisfied the equation (8) based on the calculated boiling points (T=73.3° C.). $y_1$ was determined according to the equation (9). FIG. 5(b) shows that the predicted values according to the present invention agree with the average values of actually measured values, whereas FIG. 5(b) also shows that the actually measured values are significantly variable, indicating the risk of conventional design methods based only on actually measured values. By contrast, FIGS. 4(b), 4(c), 5(a) and 5(b) show that use of the present invention allows precise prediction of VLE relationship at an arbitrary temperature and pressure. Thus, the present invention represents a landmark because it can put an end to the long absence of prediction methods.

(ii) Heptane (1)-Octane (2) System

Figure 6A:
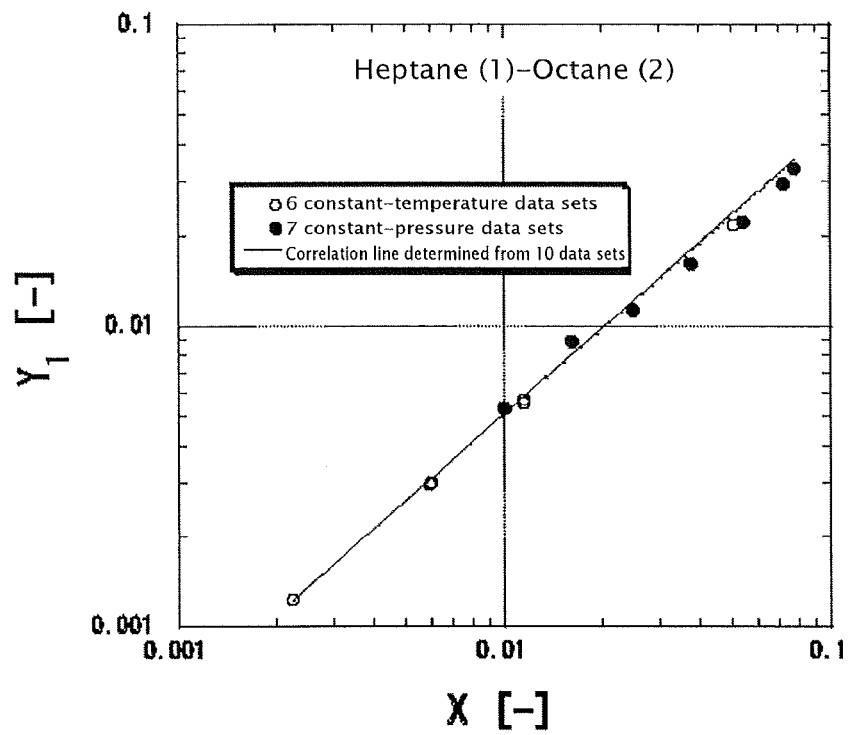
FIG. 6(a) is a diagram showing X vs. $Y_1$ relationships.
Figure 6B:
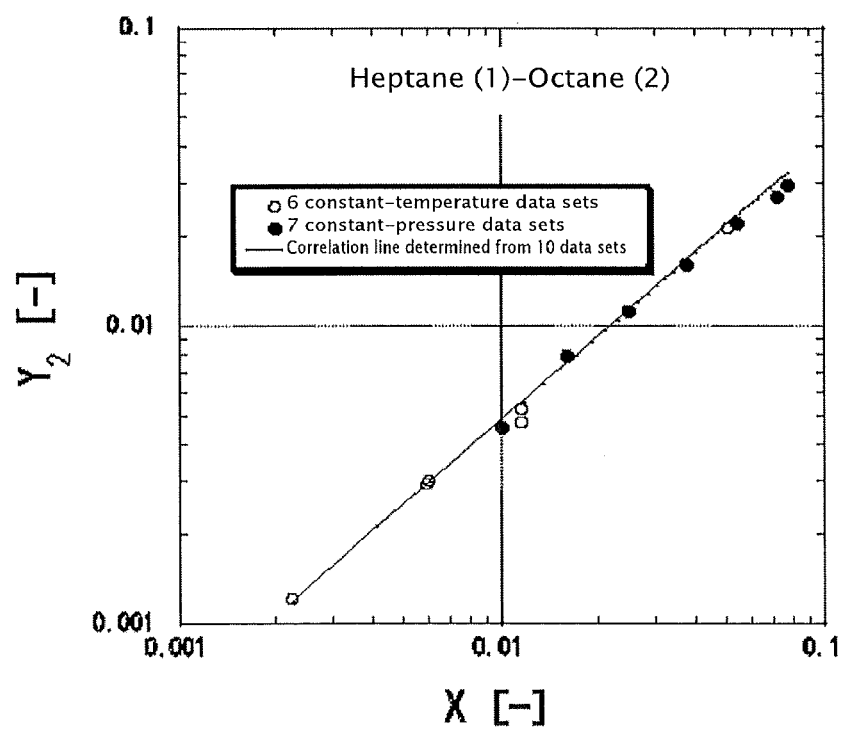
FIG. 6(b) is a diagram showing X vs. $Y_2$ relationships.

In order to examine the applicability of the present invention to the ideal system ($y_i$=1), FIG. 6(a) shows X vs. $Y_1$ relationships for the heptane (1)-octane (2) system. The binary VLE data is cited from Non-patent Document 1 (see FIG. 18). According to the equation (29), the tolerance of data reliability was set to 1%, and data deviated by 1% or more from the thermodynamic consistency line was removed. As a result, 10 out of 13 data sets fell in the error range of 1%. FIG. 6(a) also shows an X vs. $Y_1$ correlation line. The calculation of this correlation line depended on the same method as in the methanol (1)-water (2) system. FIG. 6(a) shows that: data convergence is high; and constant-temperature data and constant-pressure data converge to the same correlation line. FIG. 6(b) shows X vs. $Y_2$ relationships for the same data sets as above. In the drawing, the open circle (○) denotes constant-temperature data, and the filled circle (●) denotes constant-pressure data. In FIG. 6(b), a correlation line is also indicated. FIG. 6(b) shows that data convergence is high. FIGS. 6(a) and 6(b) demonstrate the effectiveness of the present invention for the ideal system.

(iii) 1-Propanol (1)-Water (2) System (Minimum Boiling Azeotrope)

Figure 7A:
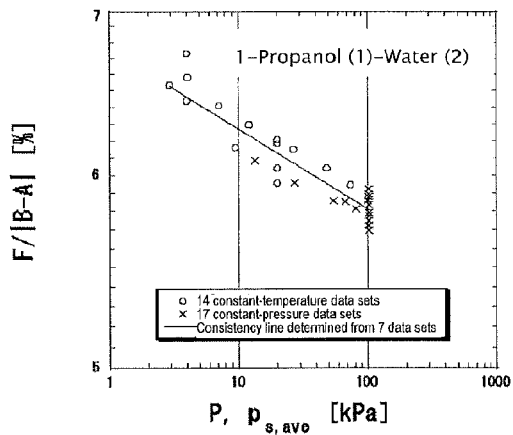
FIG. 7(a) is a diagram showing a thermodynamic consistency line for the 1-propanol (1)-water (2) system.

FIG. 7(a) shows a thermodynamic consistency line for the 1-propanol (1)-water (2) system. The binary VLE data is cited from Non-patent Document 1 (see FIG. 19). In the drawing, the open circle (○) denotes constant-temperature data, and x denotes constant-pressure data. Since this system forms minimum boiling azeotropes, the accuracy of VLE data convergence is lower than that in the methanol-water system. Also, FIG. 7(a) shows that: data converges to the line; and constant-temperature data and constant-pressure data converge to the same line. The tolerance of data reliability was set to 0.6%, and data deviated by 0.6% or more from the correlation line was excluded. As a result, 7 out of 31 data sets fell in the error range of 0.6%. Therefore, a thermodynamic consistency line determined from these 7 reliable data sets is shown in FIG. 7(a).

Figure 7B:
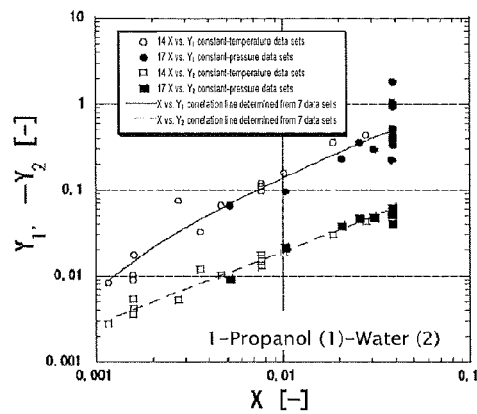
FIG. 7(b) is a diagram showing X vs. $Y_1$ and X vs. $Y_2$ relationships for the 1-propanol (1)-water (2) system.

FIG. 7(b) shows X vs. $Y_1$ relationships determined according to the Wilson equation for the 1-propanol (1)-water (2) system. In the drawing, the open circle (○) denotes X vs. $Y_1$ constant-temperature data, the filled circle (●) denotes X vs. $Y_1$ constant-pressure data, the open square (□)

denotes X vs. $Y_2$ constant-temperature data, and the filled square (■) denotes X vs. $Y_2$ constant-pressure data. For this system, vapor-liquid equilibrium relationships can be more represented by the Wilson equation than by the Margules equation. The Wilson binary parameters representing vapor-liquid equilibrium relationships are listed in Non-patent Document 1. The calculation was performed in the same way as in FIG. 4 except that the Wilson equation was used instead of the Margules equation.

The Wilson equation was as follows:

[Formula 51]
$$\ln\gamma_1 = -\ln(x_1 + \Lambda_{12}x_2) + x_2\left(\frac{\Lambda_{12}}{x_1 + \Lambda_{12}x_2} - \frac{\Lambda_{21}}{\Lambda_{21}x_1 + x_2}\right) \quad (36)$$

[Formula 52]
$$\ln\gamma_2 = -\ln(x_2 + \Lambda_{21}x_1) - x_1\left(\frac{\Lambda_{12}}{x_1 + \Lambda_{12}x_2} - \frac{\Lambda_{21}}{\Lambda_{21}x_1 + x_2}\right) \quad (37)$$

wherein $\gamma_1$ and $\gamma_2$ represent the activity coefficients of components 1 and 2, respectively; $x_1$ and $x_2$ represent the mole fractions of components 1 and 2, respectively, in the liquid phase; and $\Lambda_{12}$ and $\Lambda_{21}$ represent binary parameters. The infinite dilution activity coefficients can be associated with $\Lambda_{12}$ and $\Lambda_{21}$ by considering $x_1=0$ in the equation (36) and $x_2=0$ in the equation (37).

Figure 7C:
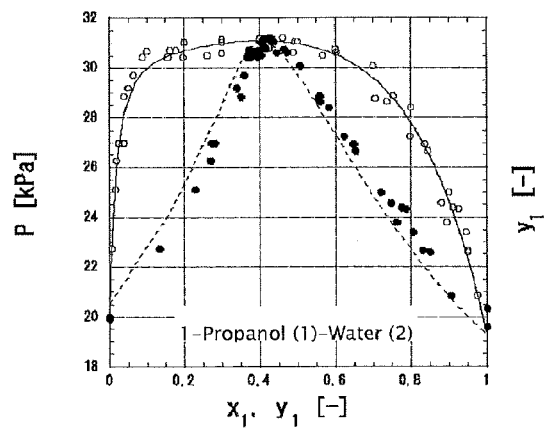
FIG. 7(c) is a diagram showing P-x and P-y relationships for the 1-propanol (1)-water (2) system at a temperature of 333.15 K.
Figure 7D:
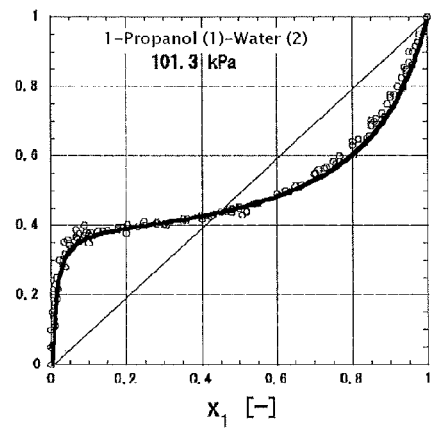
FIG. 7(d) is a diagram showing $x_1$ vs. $y_1$ relationships for the 1-propanol (1)-water (2) system at 101.3 kPa.

FIG. 7(b) shows both X vs. $Y_1$ and X vs. $Y_2$ relationships. $Y_2<0$ holds true for this system that forms minimum boiling azeotropes. Thus, in order to examine detailed data convergence, negative signs of X vs. $Y_2$ relationships are shown therein. FIG. 7(b) shows that data convergence is high even when azeotropes are formed. It also shows that constant-temperature data and constant-pressure data converge to the same correlation line. Thus, in FIG. 7(b), the representative lines of data were indicated by the solid line for the X vs. $Y_1$ correlation line and the broken line for the X vs. $Y_2$ correlation line. FIG. 7(b) demonstrates the effectiveness of the present invention for the azeotropes. In addition, the values of $\gamma_1^\infty$ and $\gamma_2^\infty$ were determined at a temperature of 333.15 K from the representative lines shown in FIG. 7(b), and P-x and P-y relationships predicted according to the Wilson equation using the values are indicated in FIG. 7(c). In the drawing, the open circle (○) denotes P-x data, the filled circle (●) denotes P-y data, the solid line denotes P-x predicted values according to the present invention, and the broken line denotes P-y predicted values according to the present invention. FIG. 7(c) shows that P-x relationships can be predicted properly. It also shows that the P-y data is less reliable. FIG. 7(d) shows x-y relationships at 101.3 kPa. FIG. 7(d) shows a diagonal representing $x_1=y_1$ by a thin solid line. Usually, it is not easy to correlate P-x data and allow x-y relationships to agree with the data (Non-patent Document 1). In spite of this fact, FIG. 7(d) shows that the predicted values according to the present invention (thick line) are in surprisingly good agreement with actually measured values (plot), indicating exceedingly good prediction, though the present invention provides pure prediction, which determines data only from the values of binary parameters and pressures. The precise determination of x-y relationships leads to the prediction of azeotropic points that give operating limits, and is thus practically important. FIGS. 7(a) to 7(d) clearly demonstrate that the correlation of X vs. $Y_1$ and X vs. $Y_2$ relationships according to the present invention is effective for the minimum boiling azeotropes.

(iv) Acetone-Chloroform System (Maximum Boiling Azeotrope)

Figure 8A:
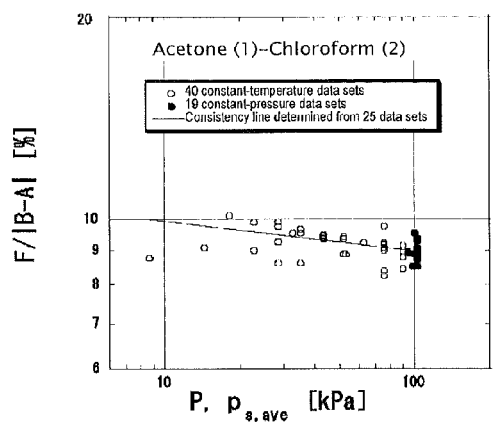
FIG. 8(a) is a diagram showing a thermodynamic consistency line for the acetone (1)-chloroform (2) system.

FIG. 8(a) shows a thermodynamic consistency line for the acetone (1)-chloroform (2) system. The binary VLE data is cited from Non-patent Document 1 (see FIG. 20). In the drawing, the open circle (○) denotes constant-temperature data, and the filled circle (●) denotes constant-pressure data. $Y_1<0$ holds true for this system that forms maximum boiling azeotropes. The Margules equation was used in analysis. FIG. 8(a) shows that: data converges to the line; and constant-temperature data and constant-pressure data converge to the same line. According to the equation (29), the tolerance of data reliability was set to 2%, and data deviated by 2% or more from the correlation line was excluded. As a result, 25 out of 59 data sets fell in the error range of 2%. A thermodynamic consistency line determined from these 25 reliable data sets is shown in FIG. 8(a).

Figure 8B:
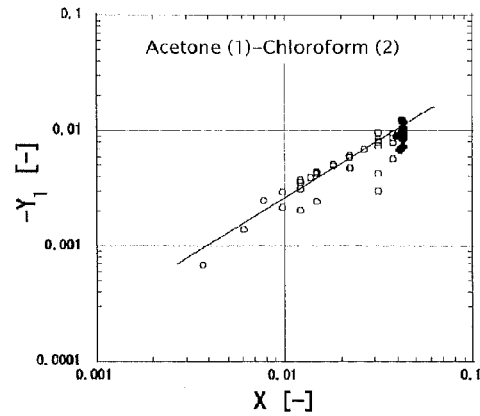
FIG. 8(b) is a diagram showing X vs. $Y_1$ relationships for the acetone (1)-chloroform (2) system.

FIG. 8(b) shows X vs. $Y_1$ relationships determined according to the Margules equation for the acetone (1)-chloroform (2) system. $Y_1<0$ holds true for this system that forms maximum boiling azeotropes. Thus, in order to examine detailed data convergence, negative signs of X vs. $Y_1$ relationships are shown therein. In FIG. 8(b), an X vs. $Y_1$ correlation line was also indicated. FIG. 8(b) shows that data convergence is high even when azeotropes are formed. It also shows that constant-temperature data and constant-pressure data converge to the same correlation line.

Figure 8C:
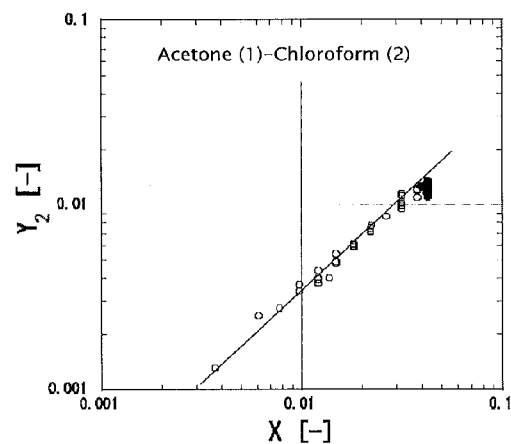
FIG. 8(c) is a diagram showing X vs. $Y_2$ relationships for the acetone (1)-chloroform (2) system.

FIG. 8(c) shows X vs. $Y_2$ relationships for the same data set as above. In FIG. 8(c), a correlation line was also indicated. FIG. 8(c) shows that data convergence is high even for the system that forms maximum boiling azeotropes. FIGS. 8(b) and 8(c) demonstrate the effectiveness of the present invention for the azeotropes.

[Correlation of LLE Data]

Next, the correlation of LLE data will be described in detail with reference to specific examples.

(i) 1-Butanol (1)-Water (2) System

Infinite dilution activity coefficients $\gamma_1^\infty$ and $\gamma_2^\infty$ can be defined from binary liquid-liquid equilibrium (mutual solubility) to determine $Y_1$ and $Y_2$. Preferably, the following UNIQUAC equation, which calculationally provides the highest convergence, is used for determining $\gamma_1^\infty$ and $\gamma_2^\infty$ from mutual solubility:

[Formula 53]
$$\ln\gamma_i = \ln\frac{\Phi_i}{x_i} + \frac{z}{2}q_i\ln\frac{\theta_i}{\Phi_i} + \Phi_i\left(l_i - \frac{r_i}{r_j}l_j\right) - q_i\ln(\theta_i + \theta_j\tau_{ji}) + \theta_jq_i\left(\frac{\tau_{ij}}{\theta_i + \theta_j\tau_{ji}} - \frac{\tau_{ij}}{\theta_j + \theta_i\tau_{ij}}\right) \quad (38)$$

[Formula 54]
$$\Phi_i = \frac{x_i r_i}{x_1 r_1 + x_2 r_2} \quad (39)$$

[Formula 55]
$$\theta_i = \frac{x_i q_i}{x_1 q_1 + x_2 q_2} \quad (40)$$

[Formula 56]
$$l_i = \frac{z}{2}(r_i - q_i) - (r_i - 1) \quad (41)$$

In the above equations, $r_i$ represents a molecular volume index, and $q_i$ represents a molecular surface area index.

These values are provided by Non-patent Document 2. Also, x; represents the mole fraction of component i; z is equal to 10 and fixed; $\tau_{ij}$ and $\tau_{ji}$ represent binary parameters; and $\Phi_i$, $\theta_i$, and $l_i$ represent variables defined by the equations (39), (40), and (41), respectively. $x_i=0$ is substituted into the equation (38) to obtain the following equation for an infinite dilution activity coefficient:

[Formula 57]

$$\ln \gamma_i^\infty = \ln\frac{r_i}{r_j} + \frac{z}{2}q_i\ln\frac{r_j q_i}{r_i q_j} + \frac{z}{2}(r_i - q_i) - (r_i - 1) - \frac{r_i}{r_j}\left[\frac{z}{2}(r_j - q_j) - (r_j - 1)\right] - q_i\ln(\tau_{ji}) + q_i(1 - \tau_{ij}) \quad (42)$$

Thus, $\tau_{ij}$ and $\tau_{ji}$ are determined according to the equations (10) and (38) from mutual solubility data at a certain temperature. Infinite dilution activity coefficients are determined according to the equation (42). Then, A and B can be determined according to the equations (6) and (7). After A and B are determined, $\beta$, X, $Y_1$, and $Y_2$ can be calculated according to the equations (14), (22), (24) and (25), respectively.

Figure 1:
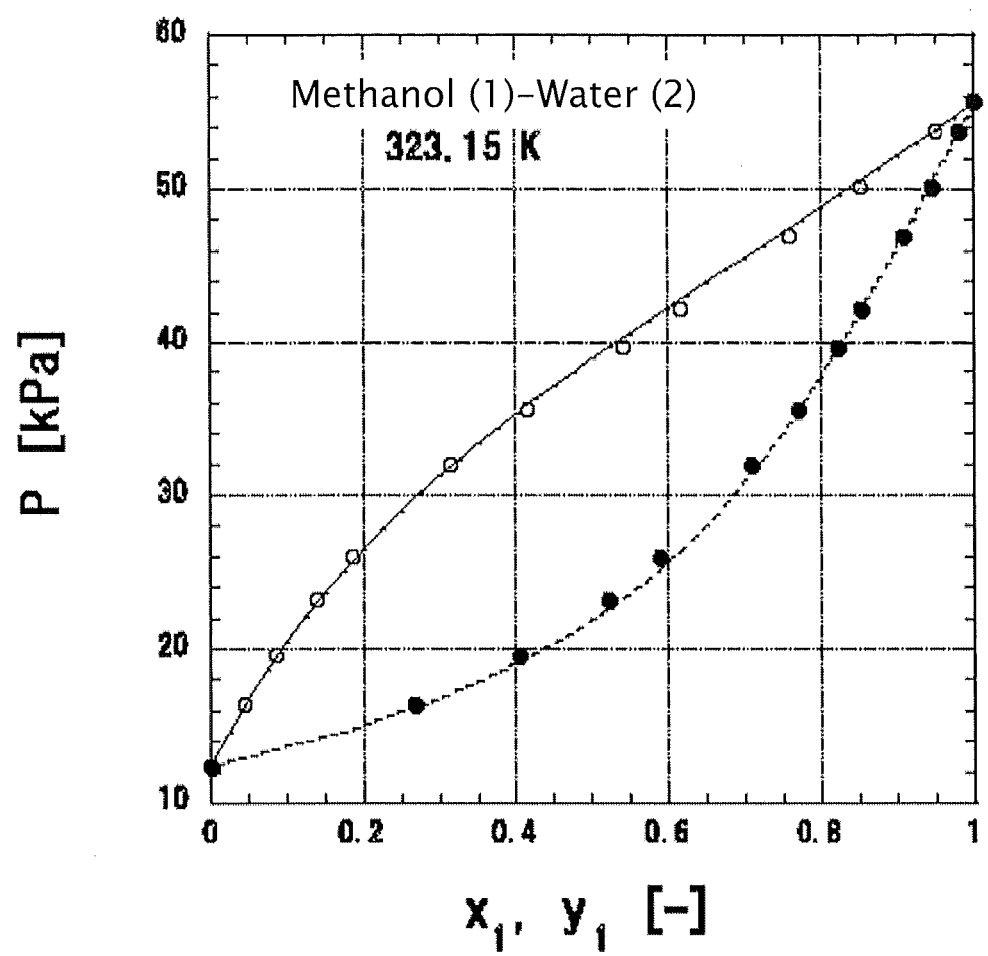
FIG. 1 is a diagram showing P-x and P-y relationships for the methanol (1)-water (2) system at a temperature of 323.15 K.
Figure 2A:
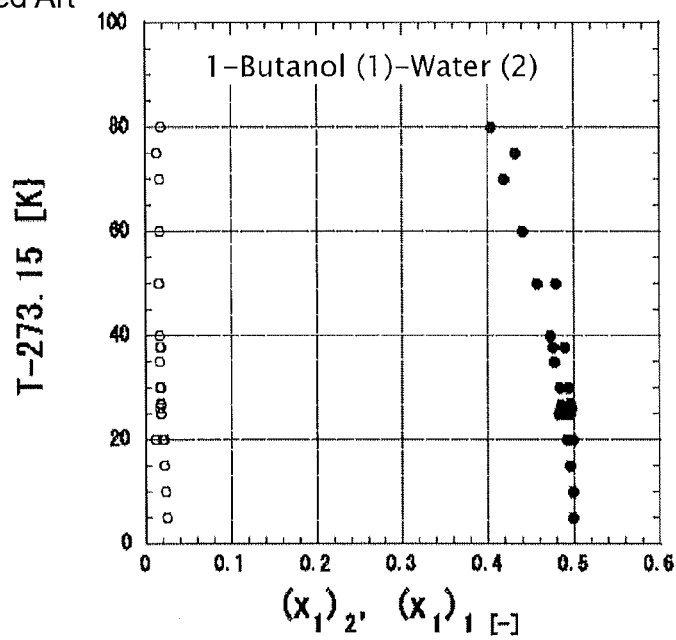
FIG. 2 is a diagram showing relationships between mutual solubility and temperature for the 1-butanol (1)-water (2) system (FIG. 2(a)) and a diagram showing relationships between mutual solubility and temperature for the 2-butanone (1)-water (2) system (FIG. 2(b))
Figure 9A:
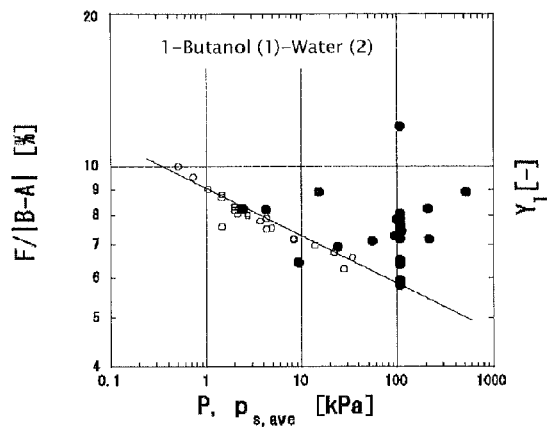
FIG. 9(a) is a diagram showing a thermodynamic consistency line for the 1-butanol (1)-water (2) system.
Figure 9B:
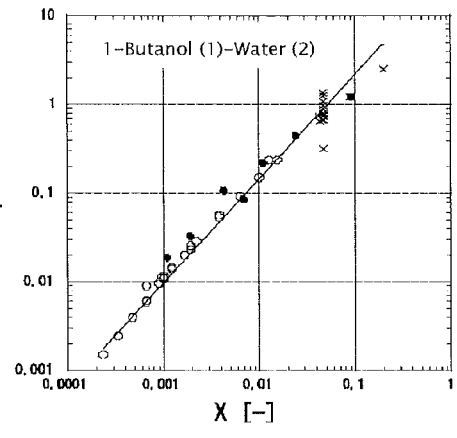
FIG. 9(b) is a diagram showing X vs. $Y_1$ relationships for the 1-butanol (1)-water (2) system.
Figure 9C:
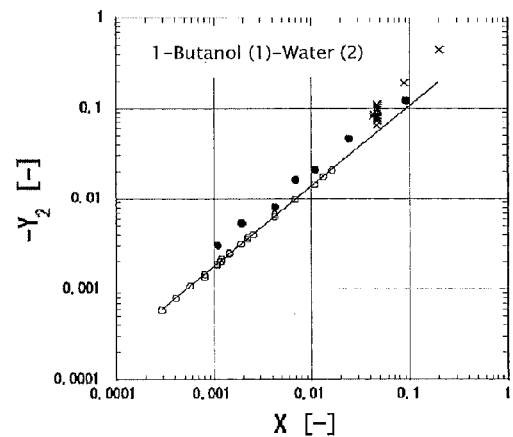
FIG. 9(c) is a diagram showing X vs. $Y_2$ relationships for the 1-butanol (1)-water (2) system.

FIG. 9(a) shows a thermodynamic consistency line for the 1-butanol (1)-water (2) system. In the drawing, the open circle (○) denotes LLE data (the data is cited from Non-patent Document 2; see FIG. 21), and the filled circle (●) denotes VLE data (the data is cited from Non-patent Document 1). From the mutual solubility data (Non-patent Document 2) shown in FIG. 2(a), the values of A and B were determined according to the UNIQUAC equation, and $\beta$ was determined from the equation (14) according to the UNIQUAC equation. Since the vapor-liquid equilibrium data for the 1-butanol (1)-water (2) system has also been reported in Non-patent Document 1, the value of $\beta$ for the VLE data determined from the equation (14) according to the UNIQUAC equation as an activity coefficient is also indicated in FIG. 9(a). FIG. 9(a) shows that: (i) liquid-liquid equilibrium data and vapor-liquid equilibrium data give the same thermodynamic consistency line (Non-patent Document 4); and (ii) liquid-liquid equilibrium data gives a more converged thermodynamic consistency line than vapor-liquid equilibrium data (Non-patent Document 5). FIG. 9(b) shows X vs. $Y_1$ relationships determined according to the UNIQUAC equation for the 1-butanol (1)-water (2) system. In the drawing, the open circle (○) denotes LLE data, the filled circle (●) denotes constant-temperature VLE data, x denotes constant-pressure VLE data, and the solid line (-) denotes a correlation line for the LLE data. FIG. 9(b) shows that LLE data and VLE data give the same X vs. $Y_1$ relationships. Specifically, FIG. 9(b) demonstrates that the present invention is effective commonly for liquid-liquid equilibrium data and vapor-liquid equilibrium data. FIG. 9(c) shows X vs. $Y_2$ relationships for the 1-butanol (1)-water (2) system. The 1-butanol (1)-water (2) system forms minimum boiling azeotropes and was thus indicated by negative signs. In the drawing, the open circle (○) denotes LLE data, the filled circle (●) denotes constant-temperature VLE data, x denotes constant-pressure VLE data, and the solid line (-) denotes a correlation line for the LLE data. In FIG. 9(c), the convergence of LLE data and VLE data was high, demonstrating the effectiveness of the present invention which determines binary parameters A and B and uses a proximity ratio to critical points determined according to the equation (22) and infinite dilution pressure gradients determined according to the equations (24) and (25), on the basis of only highly reliable data.

(ii) 2-Butanone (1)-Water (2) System

Figure 10:
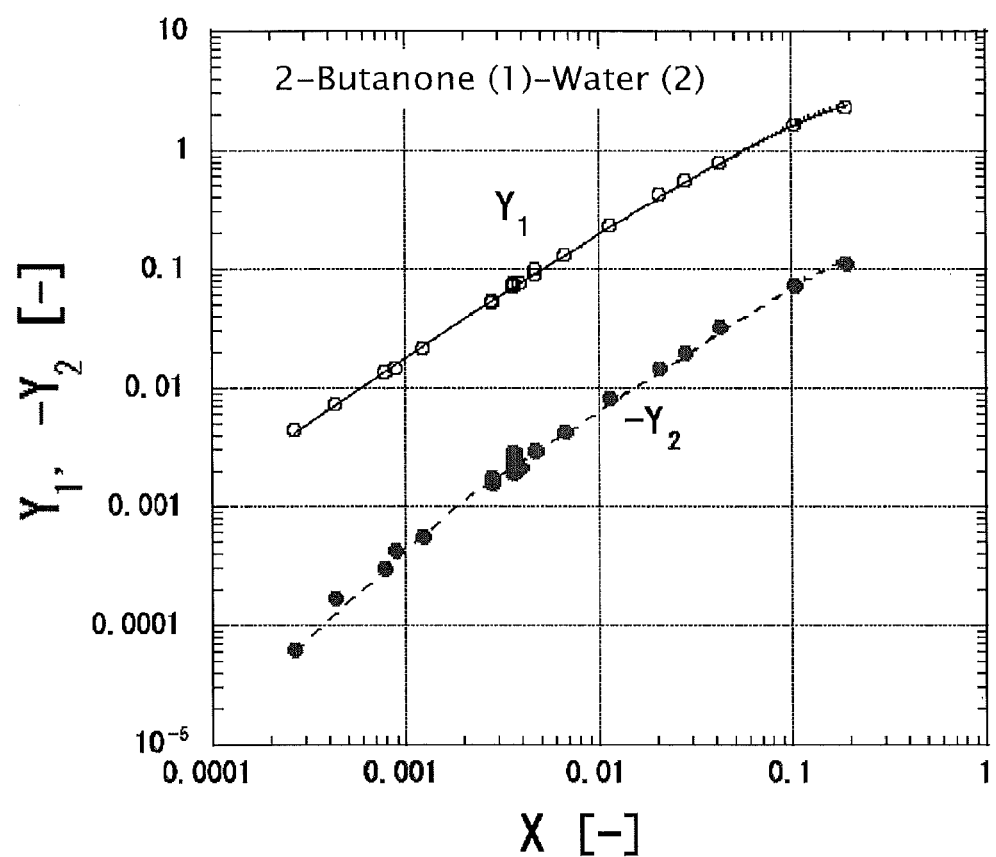
FIG. 10 is a diagram showing X vs. $Y_1$ and X vs. $Y_2$ relationships for the 2-butanone (1)-water (2) system.

FIG. 10 shows both X vs. $Y_1$ relationships (solid line with open circles (○) and X vs. $Y_2$ relationships (broken line with filled circles (●) determined according to the UNIQUAC equation for the 2-butanone (1)-water (2) system. The LLE data is cited from Non-patent Document 2 (see FIG. 22). FIG. 10 shows that by use of the index of proximity ratio to critical points infinite dilution pressure gradients can converge even to LLE data with high accuracy. Specifically, it demonstrates the effectiveness of the present invention for LLE.

[Correlation of High-Pressure VLE Data]

(i) Lumped Non-Ideality Correlation

A method involving lumping parameters for non-ideality in the liquid phase and non-ideality in the vapor phase and representing non-ideality according to the equation (28) was examined for its effectiveness. Non-patent Document 1 has reported more than 12500 low-pressure data sets, to which the lumped non-ideality correlation was applied. Correlation errors have also been reported therein. Table 1 shows relative values of correlation errors in constant-temperature P-x data according to the Margules equation reported in Non-patent Document 1.

TABLE 1

P-x correlation errors in constant-temperature VLE data

| Binary system | Number of data sets | Average correlation error [1] % |
|---|---|---|
| (Low-pressure VLE data) | | |
| Aqueous solutions | 508 | 4.20 |
| Organic compounds with OH groups | 1900 | 2.70 |
| Compounds with aldehydes, ketones, ethers | 1399 | 1.20 |
| Compounds with carboxylic acids, esters | 234 | 2.30 |
| Aliphatic hydrocarbons | 1583 | 1.20 |
| Aromatic hydrocarbons | 1007 | 1.00 |
| Compounds with halogen, nitrogen, sulfur, and others | 630 | 1.60 |
| (High-pressure VLE data) | | |
| Compounds with carbon dioxide | 112 | 1.00 |
| Whole binary system | 265 | 0.90 |

[1] $(100/n)\Sigma\Delta P_i/P_{s, ave}$
n: The number of data sets
$\Delta P_i$: Correlation error of pressure for i-th data set
$P_{s, ave}$: Average pressure of i-th data set Table 1 shows the increasing tendency of correlation errors in polar mixtures compared with errors on the order of 1% in non-polar mixtures. Table 1 also reveals the degree of correlation errors derived from the lumped non-ideality correlation previously applied to low-pressure data. A large number of binary high-pressure VLE data sets are listed in Non-patent Document 6. Thus, P-x relationships for constant-temperature VLE data that satisfied $T<T_{c1}$ ($T_{c1}$ represents the critical temperature of a light component, i.e., a component having a high vapor pressure) were subjected to the lumped non-ideality correlation according to the Margules equation to determine correlation errors of pressure in each data set. The average relative errors thereof were indicated in Table 1. Table 1 shows that correlation errors even in the high-pressure P-x data are equal to or lower than the level of hydrocarbon mixtures in low-pressure vapor-liquid equilibrium. This means that the lumped non-ideality correlation of P-x data is effective even for high-pressure data, as in low-pressure data. The conventional correlation using mixing rules for high-pressure data has the disadvantage that it cannot be applied to the prediction of VLE relationship. By contrast, particularly notable is the accomplishment of the present invention, which has found that the lumped non-ideality correlation is effective even for high-pressure data. This is because the method of the present invention can determine X vs. $Y_1$ and X vs. $Y_2$ relationships even for high-pressure VLE data at totally the same level as in low-pressure data and can be used with its effectiveness easily proved.

Figure 11:
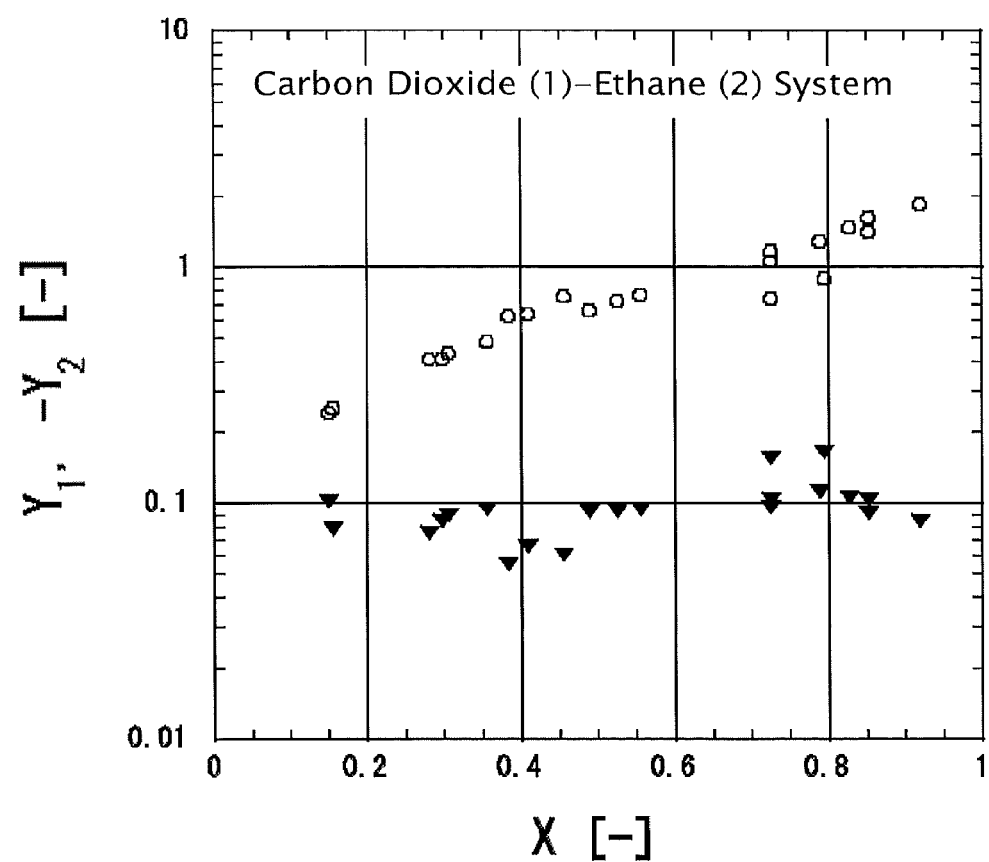
FIG. 11 is a diagram showing X vs. $Y_1$ and X vs. $Y_2$ relationships for the carbon dioxide (1)-ethane (2) system.

(ii) Correlation of Constant-Temperature/High-Pressure VLE Data for Carbon Dioxide (1)-Ethane (2) System Binary high-pressure VLE data is compiled in Non-patent Document 6. Thus, P-x relationships for the constant-temperature VLE data of the carbon dioxide (1)-water (2) system (see FIG. 23) that satisfied $T<T_{c1}$ were subjected to the lumped non-ideality correlation according to the Margules equation. $Y_1$ and $Y_2$ were calculated from the determined values of $\gamma_1^\infty$ and $\gamma_2^\infty$. FIG. 11 shows X vs. $Y_1$ and X vs. $Y_2$ relationships. In the drawing, the open circle (○) denotes X vs. $Y_1$ relationships, and the filled inverted triangle (▼) denotes X vs. $Y_2$ relationships. Since the carbon dioxide-ethane system forms minimum boiling azeotropes, negative signs of $Y_2$ are shown therein. FIG. 11 demonstrates that: both the X vs. $Y_1$ and X vs. $Y_2$ relationships give converged relationships; and the correlation method according to the present invention can also be used effectively for high-pressure vapor-liquid equilibrium data.

The most important application of the highly accurate method for correlation of phase equilibrium data of the present invention using relationships between infinite dilution pressure gradients and vapor pressures is the precise pure prediction of vapor-liquid equilibrium (VLE) relationship. Specifically, X vs. $Y_1$ and X vs. $Y_2$ relationships are individually determined by correlation from existing data, and the values of $\gamma_1^\infty$ and $\gamma_2^\infty$ are determined for the binary system on the basis of these correlations. As a result, phase equilibrium relationship can be predicted purely without the use of individual data. The effectiveness of the present invention for the pure prediction of binary VLE is expressed in terms of an example of the constant-temperature methanol (1)-water (2) system in FIG. 5(a) and an example of the constant-pressure methanol (1)-water (2) system in FIG. 5(b) as to the nonazeotropic system. Also, it is expressed in terms of an example of the constant-temperature 1-propanol (1)-water (2) system in FIG. 7(c) and an example of the constant-pressure 1-propanol (1)-water (2) system in FIG. 7(d) as to the minimum boiling azeotropes. The conventional group contribution method is known as a pure prediction method without the use of individual actually measure data, albeit with disadvantageously significantly low prediction accuracy. The pure prediction of VLE based on the correlation method according to the present invention is advantageously reliable with significantly high prediction accuracy.

Figure 2B:
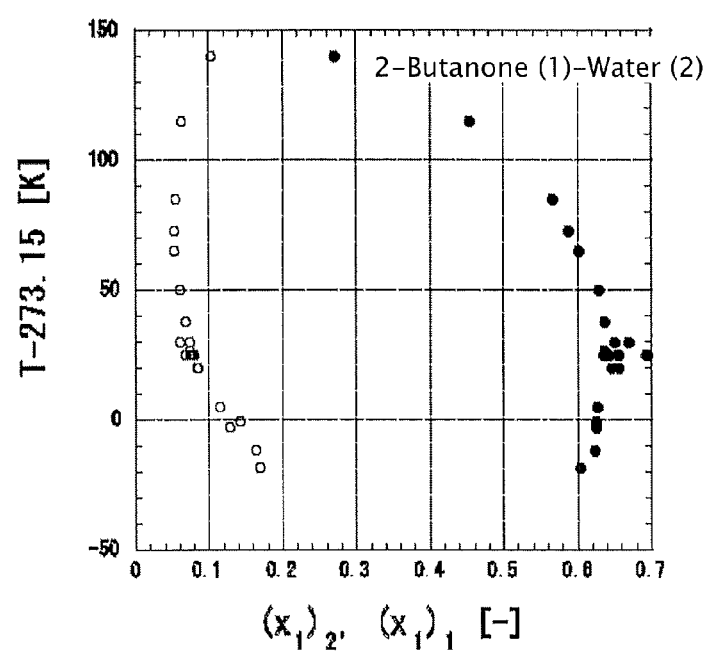
Figure 12A:
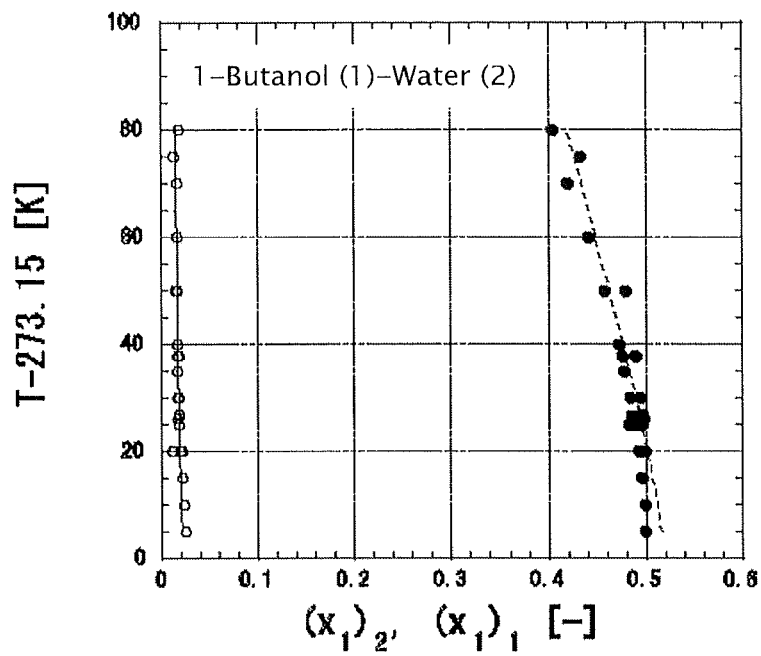
FIG. 12 is a diagram showing results of comparing mutual solubility data for the 1-butanol (1)-water (2) system (FIG. 12(a)) and the 2-butanone (1)-water (2) system (FIG. 12(b)) between actually measured values and predicted values obtained by the method of the present invention.
Figure 12B:
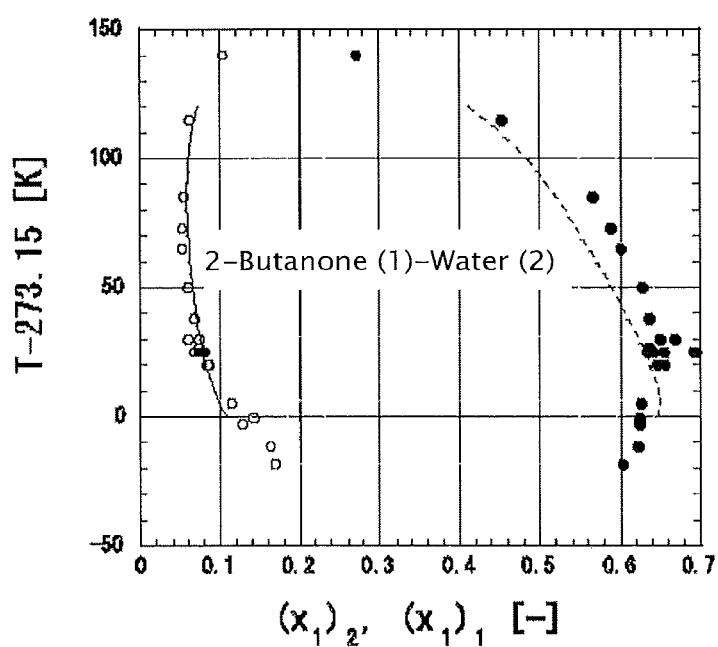

Another important application of the correlation method according to the present invention is the pure prediction of mutual solubility. None of the previously proposed methods are capable of highly accurately correlating relationships between mutual solubility and temperature. The application of the correlation method according to the present invention to binary LLE is expressed in terms of the 1-butanol (1)-water (2) system in FIG. 12(a). The mutual solubility data is the same as in FIG. 2(a). In the drawing, the open circle (○) denotes actually measured values of $(x_1)_2$ (cited from Non-patent Document 2), the filled circle (●) denotes actually measured values of $(x_1)_1$ (cited from Non-patent Document 2), the solid line (-) denotes predicted values of $(x_1)_2$ according to the present invention, and the broken line ( . . . ) denotes predicted values of $(x_1)_1$ according to the present invention. FIG. 12(a) demonstrates that mutual solubility can be predicted favorably using the present invention. Also, FIG. 12(b) shows an example of mutual solubility prediction for the 2-butanone (1)-water (2) system. The mutual solubility data is the same as in FIG. 2(b). In the drawing, the open circle (○) denotes actually measured values of $(x_1)_2$ (cited from Non-patent Document 2), the filled circle (●) denotes actually measured values of $(x_1)_1$ (cited from Non-patent Document 2), the solid line (-) denotes predicted values of $(x_1)_2$ according to the present invention, and the broken line ( . . . ) denotes predicted values of $(x_1)_1$ according to the present invention. FIG. 12(b) shows the slight difference of the data from the predicted values for $(x_1)_1$. This is because correlation functions are not properly selected for X vs. $Y_2$ relationships, as shown in FIG. 10. FIG. 12(b) demonstrates that infinite dilution activity coefficients must be correlated with significantly high accuracy for the mutual solubility prediction. This is the reason for the conventional unfavorable correlation of temperature for LLE. The method of the present invention can converge X vs. $Y_2$ relationships for LLE data with high accuracy, as shown in FIG. 10, and thus has the advantage that correlation functions can be selected strictly. FIG. 10 and FIG. 12(b) show that the correlation of LLE requires significantly high accuracy and the effectiveness of the present invention.

Figure 13:
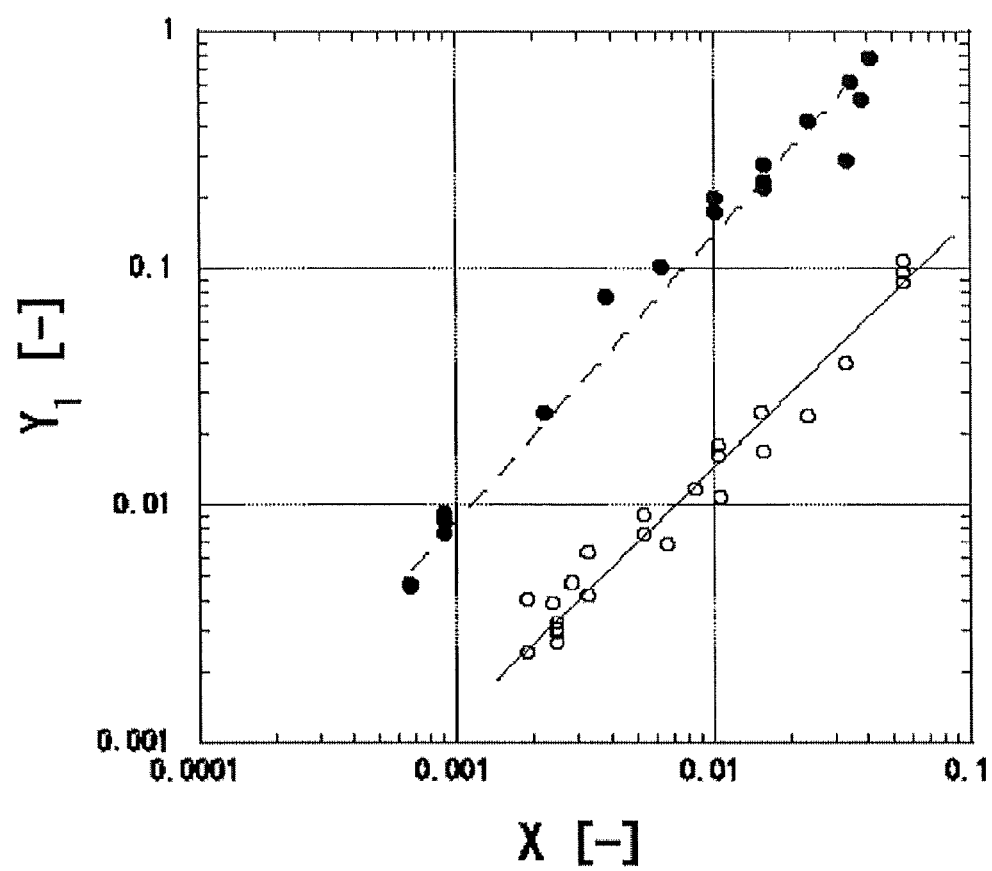
FIG. 13 is a diagram showing results of comparing X vs. $Y_1$ relationships for the methanol (1)-water (2) system and the 1-butanol (1)-water (2) system between actually measured values of infinite dilution activity coefficients and predicted values obtained by the method of the present invention on the basis of actually measured values of VLE.

The phase equilibrium relationship can be predicted precisely if the values of infinite dilution activity coefficients are correctly determined. The correlation method according to the present invention has the great advantage that it can easily give the values of infinite dilution activity coefficients. FIG. 13 shows X vs. $Y_1$ relationships (indicated by the open circle (○)) calculated for the methanol (1)-water (2) system from the actually measured values of $\gamma_1^\infty$ cited from Non-patent Document 7. In FIG. 13, X vs. $Y_1$ relationships determined from the VLE data shown in FIG. 4(b) are also indicated by the solid line (-). These results are in good agreement with each other. FIG. 13 further shows results of similar comparison for the 1-butanol (1)-water (2) system. In the drawing, the filled circle (●) denotes $\gamma_1^\infty$ data for the 1-butanol (1)-water (2) system, and the broken line (- -) denotes a representative line of VLE data for the 1-butanol (1)-water (2) system. FIG. 13 demonstrates that the values of infinite dilution activity coefficients determined from VLE data using the converged correlations obtained by the present invention agree with the actually measured values of infinite dilution activity coefficients. As shown in FIGS. 4(d) and 4(c), it has been considered that reliable infinite dilution activity coefficients cannot be determined from VLE data. The correlation method developed by the present invention produces high convergence, breaks through this common knowledge and serves as a novel reliable approach capable of providing infinite dilution activity coefficients. Particularly, a method for measuring infinite dilution activity coefficients has not yet been found for heavy components, such as water in alcohol. The method of the present invention can correlate more accurately X vs. $Y_2$ relationships for heavy components than X vs. $Y_1$ relationships for the same. Specifically, as is evident from these results, the method of the present invention can determine infinite dilution activity coefficients, which are basic determinants necessary for phase equilibrium relationship, from abundant VLE data and as such, is exceedingly useful.

[Prediction of Azeotrope]

Figure 14A:
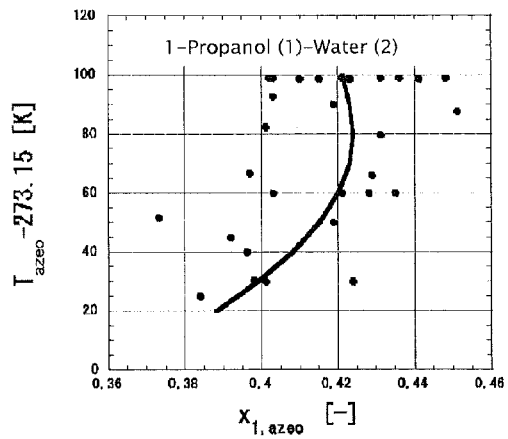
FIGS. 14(a) to 14(d) are diagrams for the 1-propanol (1)-water (2) system, the 1-butanol (1)-water (2) system, the benzene (1)-methanol (2) system, and the acetone (1)-chloroform (2) system, respectively.
Figure 14B:
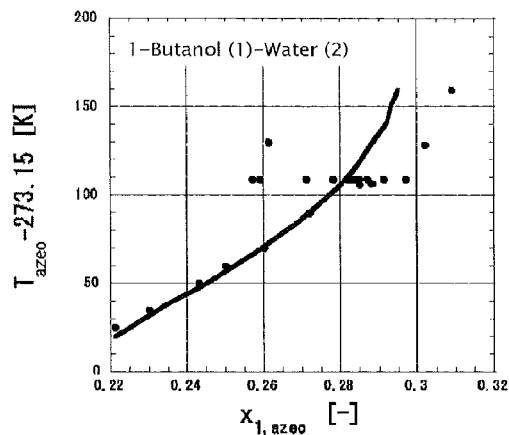
Figure 14C:
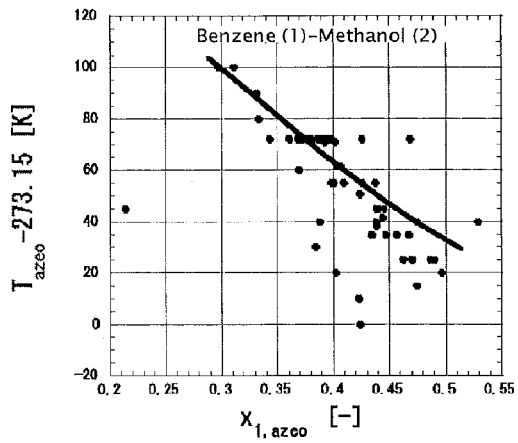
Figure 14D:
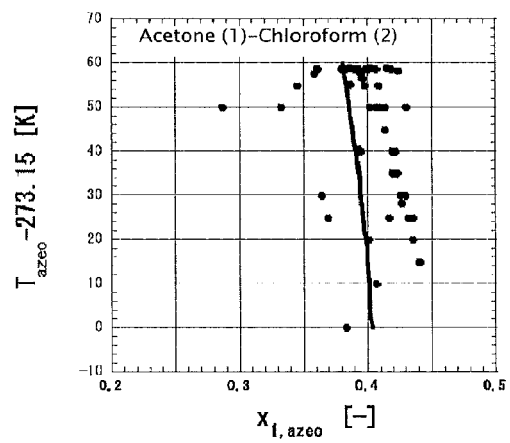

Mixtures cannot be enriched by a distillation method at a temperature exceeding the azeotropic point. The definition of relationships between the composition of azeotropes and temperature is exceedingly important for determining the operational conditions of distillation. The method of the present invention can purely predict precise vapor-liquid equilibrium relationship and consequently has the great advantage that it can highly accurately predict azeotropes whose highly accurate prediction has been difficult for conventional methods. FIG. 14(a) shows relationships between the composition of an azeotrope and temperature for the 1-propanol (1)-water (2) system. Since binary parameters A and B determined from the Margules equation are provided by Non-patent Document 1, the relationships are obtained for VLE data using these parameters. X vs. $Y_1$ and X vs. $Y_2$ relationships are obtained using the Margules equation, and relationships between composition $x_{1,azeo}$ of an azeotrope and a temperature $T_{azeo}$ calculated from these correlations are indicated by the solid line in FIG. 14(a). In addition, similar relationships are indicated for the 1-butanol (1)-water (2) system, the benzene (1)-methanol (2) system, and the acetone (1)-chloroform (2) system in FIGS. 14(b), 14(c), and 14(d), respectively. In FIGS. 14(a) to 14(c), the data and the predicted values are in good agreement with each other, demonstrating that the correlation method according to the present invention is effective for the prediction of azeotropic points.

[Assessment of Phase Equilibrium Data Consistency]

Aside from thermodynamic consistency lines, data consistency can be assessed using the data convergence of X vs. $Y_1$ and X vs. $Y_2$ relationships. Particularly, data consistency can be assessed easily if relationships between an index X of proximity ratio to critical points and infinite dilution pressure gradients converge to a line. This assessable data consistency means that the correlation method according to the present invention produces high data convergence.

[Prediction of Ternary VLE]

Three sets of binary parameters for basic binary systems constituting a ternary system can be determined from ternary VLE data by use of activity coefficient equations such as Margules, UNIQUAC, Wilson, and NRTL equations. Thus, when X vs. $Y_1$ and X vs. $Y_2$ relationships determined from ternary VLE data agree with X vs. $Y_1$ and X vs. $Y_2$ relationships determined from binary VLE data, the ternary data can be assessed as being consistent. On the other hand, three sets of binary parameters for basic binary systems can be determined on the basis of X vs. $Y_1$ and X vs. $Y_2$ relationships determined from binary VLE data, and used in the prediction of ternary VLE relationship. An example of the ternary system using the Margules equation is shown below. The activity coefficient equation of component i in the multicomponent system is obtained by differentiating an excess function $g^E$ by the number of moles $n_i$ of component i as follows:

[Formula 58]

$$\ln \gamma_i = \frac{\partial g^E \sum_{k=1}^{n} n_k}{\partial n_i} \quad (43)$$

For the ternary system, $g^E$ is represented by the following Margules equation (see Non-patent Document 8):

[Formula 59]

$$g^E = x_1 x_2 (x_1 B_{12} + x_2 A_{12}) + x_2 x_3 (x_2 B_{13} + x_3 A_{13}) + x_2 x_3 (x_2 B_{23} + x_3 A_{23}) + x_1 x_2 x_3 (B_{12} + A_{13} + B_{23}) \quad (44)$$

wherein $g^E$ represents an excess function; $x_i$ represents the mole fraction of component i in the liquid phase; and $A_{ij}$ and $B_{ij}$ represent binary parameters consisting of i and j in the binary system. Specific equations for extending the UNIQUAC, NRTL, or Wilson equation to the multicomponent system is shown in Non-patent Document 3. Since three sets of binary parameters constituting the ternary system, i.e., a total of 6 binary parameters, can be determined using the present invention, the excess function and the activity coefficient can be determined according to the equations (44) and (43), respectively. For the multicomponent system, the activity coefficient can be easily determined directly by numerical differentiation of the equation (43). Also, the pressure can be determined according to the following equation:

[Formula 60]

$$P = \sum_{k=1}^{n} \gamma_k x_k p_{ks} \quad (45)$$

wherein P represents a system pressure; $\gamma_k$ represents the activity coefficient of component k; $x_k$ represents the mole fraction of component k in the liquid phase; and $p_{ks}$ represents the vapor pressure of component k. In order to demonstrate that the present invention can be applied to the prediction of multicomponent vapor-liquid equilibrium, Table 2 compares predicted values (calculated values) of pressure according to the present invention with actually measured values (the data is cited from Part 1a, p. 494 of Non-patent Document 1) for the water (1)-methanol (2)-ethanol (3) ternary system at 298.15 K. $A_{ij}$, $B_{ij}$, etc., in the equation (44) are calculated from the correlation equation according to the present invention using actually measured values of three binary vapor-liquid equilibria consisting of the water (1)-methanol (2) system, the water (1)-ethanol (3) system, and the methanol (2)-ethanol (3) system. Table 2 shows that: the measured and predicted values of pressure agree with each other with a difference of 0.5% when mole fractions $x_1$ and $x_2$ of water and methanol in the liquid phase have various values; and average errors of mole fractions $y_1$ and $y_2$ in the vapor phase are merely 0.8%. Thus, the values are in surprisingly good agreement. These results demonstrate that multicomponent vapor-liquid equilibrium can be predicted with exceedingly high accuracy using the present invention.

TABLE 2

Comparison between actually measured VLE data and predicted values of ternary VLE according to the present invention for water (1)-methanol (2)-ethanol (3) system

| $x_1$ | $x_2$ | $y_1$ | $y_2$ | P |
|---|---|---|---|---|
| Actually measured value | | | | |
| 0.0955 | 0.0992 | 0.077 | 0.183 | 64.59 |
| 0.103 | 0.1974 | 0.072 | 0.335 | 70.87 |
| 0.094 | 0.7047 | 0.035 | 0.847 | 103.98 |

TABLE 2-continued

Comparison between actually measured VLE data and predicted values of ternary VLE according to the present invention for water (1)-methanol (2)-ethanol (3) system

| $x_1$ | $x_2$ | $y_1$ | $y_2$ | P |
|---|---|---|---|---|
| 0.0966 | 0.8067 | 0.032 | 0.915 | 110.71 |
| 0.1513 | 0.2243 | 0.1 | 0.37 | 72.18 |
| 0.2989 | 0.1525 | 0.191 | 0.267 | 64.98 |
| Calculated value | | | | |
| 0.0955 | 0.0992 | 0.0789 | 0.1829 | 64.98 |
| 0.103 | 0.1974 | 0.0738 | 0.3347 | 70.92 |
| 0.094 | 0.7047 | 0.0353 | 0.8476 | 104.24 |
| 0.0966 | 0.8067 | 0.0317 | 0.9155 | 111.39 |
| 0.1513 | 0.2243 | 0.0996 | 0.3712 | 71.94 |
| 0.2989 | 0.1525 | 0.186 | 0.2688 | 65.61 |

[Prediction of Phase Equilibrium Using Homologous Series]

Figure 15A:
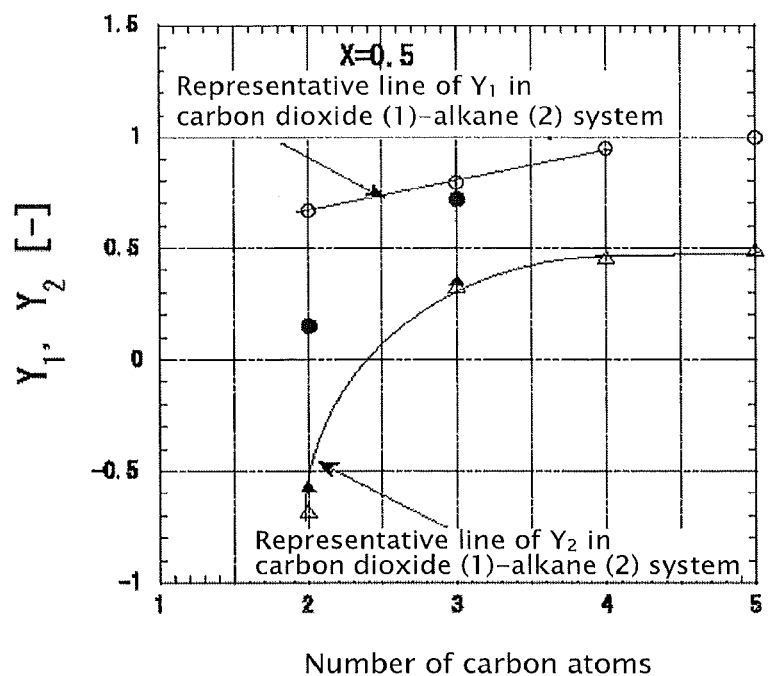
FIG. 15(a) is a diagram showing relationships between the number of carbon atoms in hydrocarbon and $Y_1$ or $Y_2$ for the carbon dioxide (1)-alkane (2) system and the carbon dioxide (1)-alkene (2) system.

The method according to the present invention has the high correlation accuracy of X vs. $Y_1$ and X vs. $Y_2$ relationships and thus permits phase equilibrium prediction using homologous series, which has been difficult to conventional methods for prediction of phase equilibrium. FIG. 15(a) shows relationships between the number of carbon atoms and $Y_1$ and $Y_2$ determined at X=0.5 for the carbon dioxide (1)-alkane (2) system and the carbon dioxide (1)-alkene (2) system from high-pressure VLE data (cited from Non-patent Document 6). In FIG. 15(a), the X vs. $Y_1$ and X vs. $Y_2$ relationships are indicated by the open circle (○) and the open triangle (Δ), respectively, for the carbon dioxide (1)-alkane (2) system. Also, the X vs. $Y_1$ and X vs. $Y_2$ relationships are indicated by the filled circle (●) and the filled triangle (▲), respectively, for the carbon dioxide (1)-alkene (2) system. The tendency in which the values of $Y_1$ and $Y_2$ increase with increase in the number of carbon atoms is clearly shown for all the homologous series. FIG. 15(a) also shows that the value of $Y_2$ is substantially the same between alkane and alkene having the same number of carbon atoms. It further shows that these systems form minimum boiling azeotropes at $Y_2<0$ for ethane or ethylene and can be handled easily as asymmetric systems when the number of carbon atoms becomes larger than that of butane (i.e., X=$Y_2$=0.5 is satisfied). It should be understood that such uniform relationships of high-pressure VLE data can be established for homologous series because the present invention successfully provides highly accurate correlation.

Figure 15B:
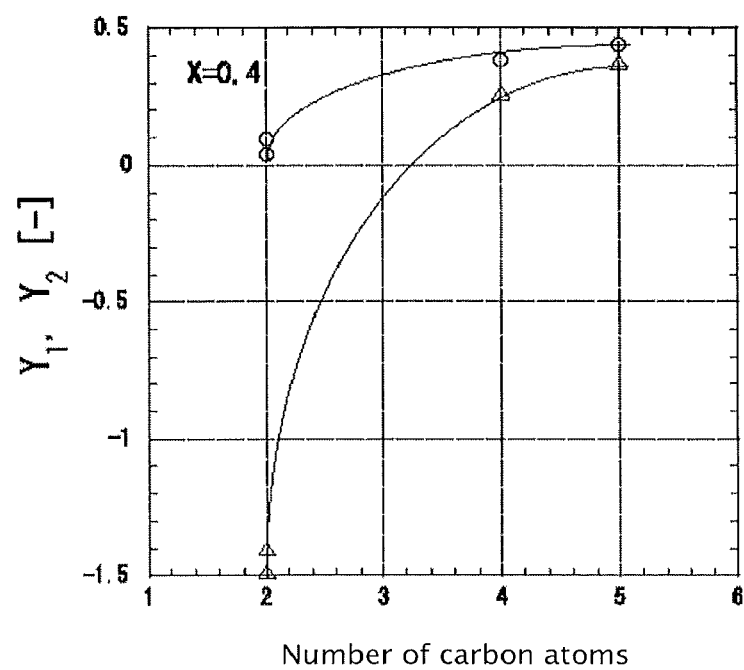
FIG. 15(b) is a diagram showing relationships between the number of carbon atoms in hydrocarbon and $Y_1$ or $Y_2$ for the hydrogen sulfide (1)-alkane (2) system.

FIG. 15(b) shows relationships between the number of carbon atoms and $Y_1$ and $Y_2$ determined at X=0.4 for the hydrogen sulfide (1)-alkane (2) system from high-pressure VLE data (cited from Non-patent Document 6). In this context, the X vs. $Y_1$ and X vs. $Y_2$ relationships are indicated by the open circle (○) and the open triangle (Δ), respectively. Again, the tendency in which the values of $Y_1$ and $Y_2$ increase with increase in the number of carbon atoms is clearly shown in FIG. 15(b). FIG. 15(b) also shows that this system forms minimum boiling azeotropes at $Y_2<0$ for hydrogen sulfide (1)-ethane (2) system and can be handled as an asymmetric system when the number of carbon atoms in alkane is close to 5 (i.e., $Y_1=Y_2=0.4$ holds)). Constant-temperature data for defining binary parameters A and B is absent for propane, a principal component of natural gases. FIG. 15(b) demonstrates that the values of $Y_1$ and $Y_2$ and, by extension, $\gamma_1^\infty$ and $\gamma_2^\infty$ can be predicted even for undocumented hydrogen sulfide (1)-alkane (2) systems by use of the representative line representing homologous series relationship. In addition, phase equilibrium relationship can be predicted accurately by use of homologous series relationship for binary systems that are less reliable due to the limited number of data sets. Hydrogen sulfide, which is an extremely poisonous substance, is limited in measurement data. The absence of phase equilibrium data containing hydrogen sulfide has been a difficult-to-solve problem in, for example, the design of natural gas processing. In such a case, the present invention, which has achieved phase equilibrium prediction using homologous series, is of great significance.

[Prediction of Vapor-Liquid Equilibrium Using Atomic Group Contribution Method]

Conventional atomic group contribution methods, such as the UNIFAC method, are characterized in that they are significantly low in prediction accuracy since they determine the values of groups vs. parameters by using all existing phase equilibrium data and the values are used as constant values. By contrast, the atomic group contribution method based on the present invention selects only binary systems including atomic groups required, determines the logarithmic values of infinite dilution activity coefficients from the X vs. $Y_1$ and X vs. $Y_2$ relationships at a temperature or pressure of interest, and determines the group contribution to nondimensional infinite dilution excess partial molar free energy, i.e., ln $\gamma_i^\infty$. Thus, the method based on the present invention is characterized by high prediction accuracy. An example in which the vapor-liquid equilibrium for a system of 1-propanol (1)+water (2) is predicted by the atomic group contribution method will be explained.

(a) Determination of atomic group: In this step, a methyl group ($CH_3$) and a methylene group ($CH_2$) are indicated by Me, identically, and the system of 1-propanol (1)+water (2) consists of three atomic groups: Me, OH and $H_2O$.

(b) Selection of reference binary systems including atomic groups: A system of methanol (1)+water (2) and a system of ethanol (1)+water (2) are selected as binary systems including Me, OH and $H_2O$.

(c) The values of $Y_1$ and $Y_2$ are determined for the reference binary systems at a temperature or pressure at which vapor-liquid equilibrium is to be determined. For example, for the system of methanol (1)+water (2), $Y_1$ and $Y_2$ are determined according to the equations (34) and (35), respectively. From these values, the values of ln $\gamma_1^\infty$ and ln $\gamma_2^\infty$ are determined for the respective reference binary systems.

(d) The group contribution to ln $\gamma_1^\infty$ and ln $\gamma_2^\infty$ is formulated. Specifically, since methanol consists of an Me group and an OH group and ethanol consists of two Me groups and an OH group, the following equation holds for methanol (MeOH):

[Formula 61]

$$(\ln \gamma_1^\infty)_{MeOH} = \ln \gamma_{Me/H2O}^\infty + \ln \gamma_{OH/H2O}^\infty$$

The following equation holds for ethanol (EtOH):

[Formula 62]

$$(\ln \gamma_1^\infty)_{EtOH} = 2 \ln \gamma_{Me/H2O}^\infty + \ln \gamma_{OH/H2O}^\infty$$

wherein $(\ln \gamma_1^\infty)_{MeOH}$ represents the ln $\gamma_1^\infty$ of the system of methanol (1)+water (2); $(\ln \gamma_1^\infty)_{EtOH}$ the ln $\gamma_1^\infty$ of the system of ethanol (1)+water (2); ln $\gamma_{i/H2O}^\infty$ represents a logarithmic value of an infinite dilution activity coefficient in water for an atomic group i, wherein the logarithmic value is regarded as justifying the additivity of atomic groups. The contribution to the two atomic groups, i.e., ln $\gamma_{Me/H2O}^\infty$ and ln $\gamma_{OH/H2O}^\infty$, can be determined according to those two equations. ln $\gamma_2^\infty$ is represented in the same manner as above.

Specifically, the following equation holds for methanol (MeOH):

[Formula 63]

$$(\ln \gamma_2^\infty)_{MeOH} = \ln \gamma_{Me/H2O}^\infty + \ln \gamma_{H2O/OH}^\infty$$

The following equation holds for ethanol (EtOH):

[Formula 64]

$$(\ln \gamma_2^\infty)_{EtOH} = 2 \ln \gamma_{H2O/Me}^\infty + \ln \gamma_{H2O/OH}^\infty$$

wherein $(\ln \gamma_2^\infty)_{MeOH}$ represents the $\ln \gamma_2^\infty$ of the system of methanol (1)+water (2); $(\ln \gamma_2^\infty)_{EtOH}$ represents the $\ln \gamma_2^\infty$ of the system of ethanol (1)+water (2); $\ln \gamma_{H2O/i}^\infty$ represents a logarithmic value of an infinite dilution activity coefficient in a pure atomic group i for water.

The contribution to the two atomic groups, i.e., $\ln \gamma_{H2O/Me}^\infty$ and $\ln \gamma_{H2O/OH}^\infty$, can be determined according to those two equations. Since the free energy contribution to the atomic groups has been determined, Margules binary parameters A and B can be determined for the system of 1-propanol (1)+water (2).

[Formula 65]

$$A = \ln \gamma_1^\infty = 3 \ln \gamma_{Me/H2O}^\infty + \ln \gamma_{OH/H2O}^\infty$$

$$B = \ln \gamma_2^\infty = 3 \ln \gamma_{H2O/Me}^\infty + \ln \gamma_{H2O/OH}^\infty$$

As a method for prediction of a vapor-liquid equilibrium relationship from the values of A and B, for example, the method described for FIGS. 5(a) and 5(b) may be used. Alternatively, much more binary system of alcohol (1)+water (2) may be added as a reference binary system of FIG. 5(b) to determine the group contribution as an average value.

The method for prediction of phase equilibrium according to the present invention can be used in the apparatus or operational design of a distillation column, an absorption column, an extraction column, or a crystallizer, which inevitably requires phase equilibrium relationship. For such use, the method of the present invention can be incorporated, as described above, in software for phase equilibrium calculation and applied thereto. Also, such use encompasses the determination of the sizes of individual apparatuses as well as the design and control of a separation process using a plurality of apparatuses in combination. In Example 1, an example of design calculation for determining the number of equilibrium stages in a stage contact-type distillation column is compared between use of the present invention and use of a conventional method dependent on measurement data.

Example 1

Figure 16:
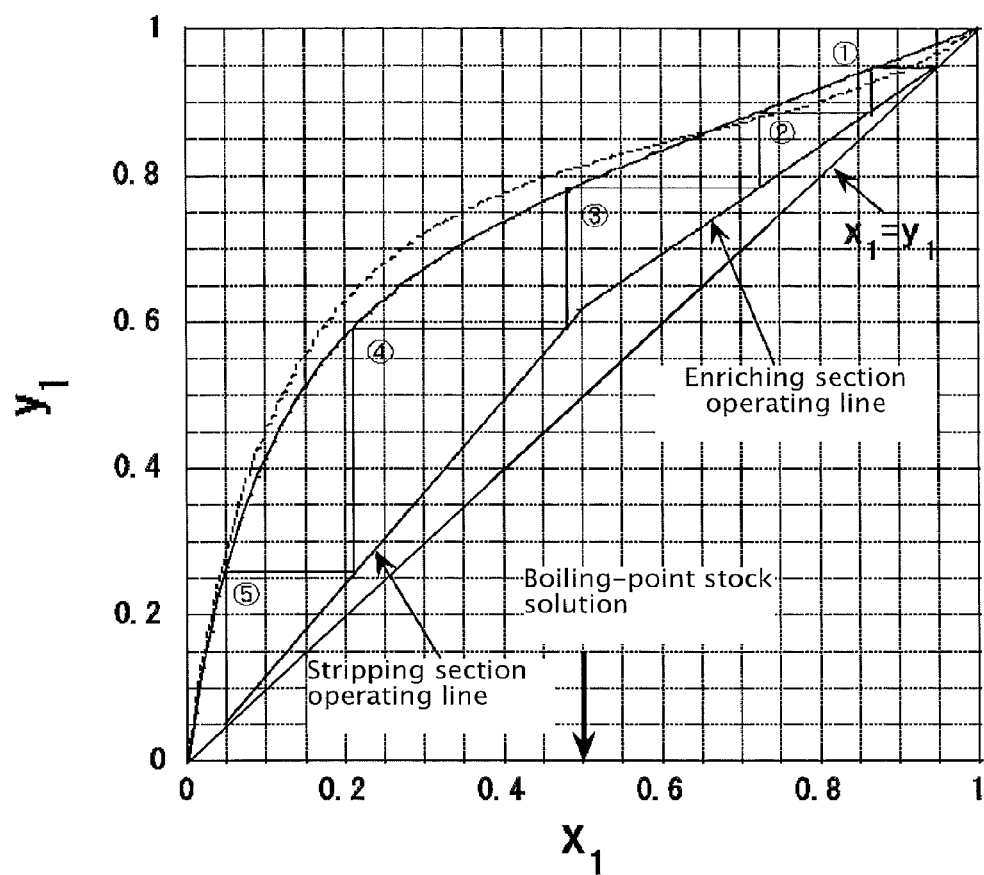
FIG. 16 is a diagram showing the calculation of the number of equilibrium stages in a distillation column using x-y relationships determined by the method for prediction of phase equilibrium data of the present invention.

Calculation of Equilibrium Stages in Distillation Column According to McCabe-Thiele Method The case is assumed where a 50 mol % methanol (1)-water (2) mixed solution is supplied as a boiling solution to a plate column at 101.3 kPa, and 95% concentrates are obtained from the top of the column while 5% bottoms are obtained from the bottom of the column. The reflux ratio is set to 3. The vapor-liquid equilibrium of the methanol (1)-water (2) system at 101.3 kPa is determined according to the present invention, and x-y relationships are given by the solid line of FIG. 16. The x-y relationships are determined from two representative lines drawn in FIG. 5(b). The specific calculation method thereof is as follows: first, the boiling points of methanol and water at 101.3 kPa are calculated to determine an average boiling point. X at this average boiling point is calculated according to the equation (22). Next, the values of $Y_1$ and $Y_2$ are determined from the value of X according to the equations (34) and (35), respectively. Subsequently, $\gamma_1^\infty$ and $\gamma_2^\infty$ are calculated from the equations (24) and (25), respectively, and A and B are determined according to the equations (6) and (7), respectively. Subsequently, a temperature that satisfies the equation (8) is determined by boiling point calculation. Since vapor pressures can be calculated from the thus-determined boiling point, the value of $y_1$ for $x_1$ is determined according to the equation (9). In this way, x-y relationships are calculated. The number of equilibrium stages appropriate for the design conditions is determined using the McCabe-Thiele method. An enriching section operating line and a stripping section operating line are drawn, and stepwise graphics are created with mole fractions of methanol from 0.95 to 0.05 between the operating line and the equilibrium line to determine 5 stages. As a result of subtracting the equilibrium stage of the distillation still therefrom, it is determined that 4 equilibrium stages are necessary. A raw material supply stage corresponds to the third stage from the top.

Comparative Example 1

A large number of vapor-liquid equilibrium data sets at 101.3 kPa have been reported. Using the data sets listed in Part 1 of page 43 of Non-patent Document 1, x-y relationships are given by the dotted line of FIG. 16. As a result of creating similar stepwise graphics using these data sets, 5.6 stages are determined. This means that a difference of 10% or more appears. In this case, a raw material supply stage corresponds to the fourth stage from the top, which largely differs from the correct value (third stage). Apparatus design based on such data is risky.

Example 2

Application of Atomic Group Contribution Method

Existing group contribution methods such as the UNIFAC or ASOG method determine group parameters without excluding errors from measurement data, whereas the atomic group contribution method according to the present invention is characterized by exceedingly high accuracy in application because the method uses a highly accurate method for correlation of infinite dilution activity coefficients to exclude measurement errors. In the application of the contribution method, data correlated with high accuracy by excluding measurement errors may also be analyzed in the same manner as a conventional method such as the UNIFAC or ASOG method to determine group parameters. Alternatively, a method of determining the atomic group contribution to nondimensional infinite dilution excess partial molar free energies, $\ln \gamma_1^\infty$ and $\ln \gamma_2^\infty$, may be used. Based on the system of alkanol (1)+water (2), an example of the application of the atomic group contribution method will be shown below.

Figure 24:
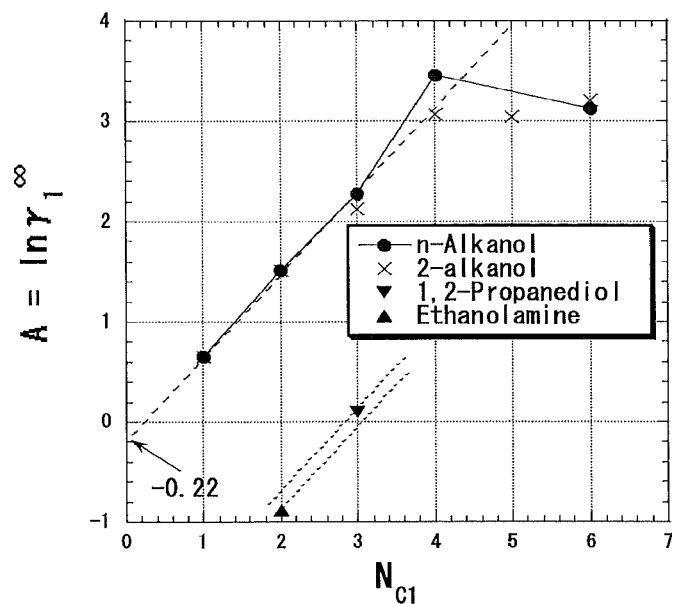
FIG. 24 is a diagram showing the value of A determined from a carbon number $N_{c1}$ and the high accurate correlation according to the present invention, for the n-alkanol (1)+water (2) system, the 2-alkanol (1)+water (2) system, the 1,2-propanediol (1)+water (2) system, and the ethanolamine (1)+water (2) system at 40° C.
Figure 25:
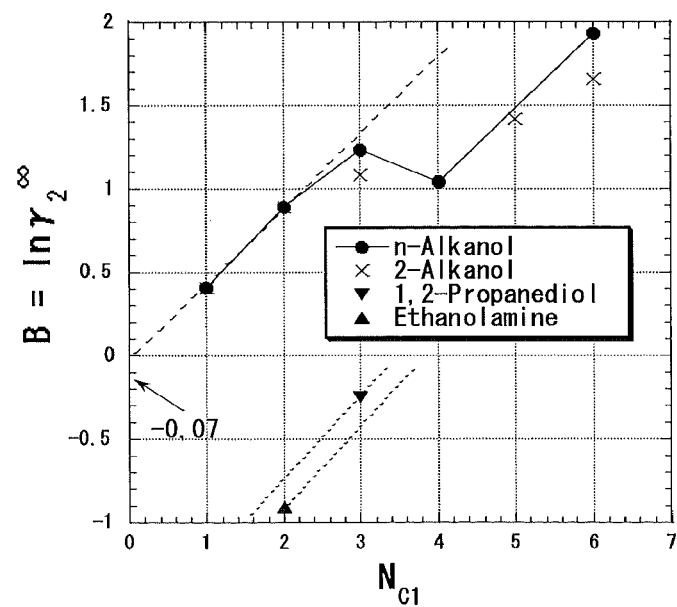
FIG. 25 is a diagram showing the value of B determined from a carbon number $N_{c1}$ and the high accurate correlation according to the present invention, for the n-alkanol (1)+water (2) system, the 2-alkanol (1)+water (2) system, the 1,2-propanediol (1)+water (2) system, and the ethanolamine (1)+water (2) system at 40° C.

Vapor-liquid equilibrium measurement values for the binary system of n-alkanol (1)+water (2) comprising an alkanol selected from alkanols ranging from methanol to hexanol as a first component and water as a second component are correlated according to the Margules equation to determine Margules binary parameters, which are given by Non-patent Document 1. First, these parameters are used for the highly accurate correlation according to the present invention to determine correlation equations for X vs. $Y_1$ and X vs. $Y_2$ relationships. Since only one data set has been found for the system of 2-hexanol (1)+water (2), the X vs. $Y_1$ relationship is approximated by a straight line connecting $(X, Y_1)$ and the origin. The X vs. $Y_2$ relationship is approximated in the same manner as the X vs. $Y_1$ relationship. From these correlation equations, the values of Margules parameters A and B (i.e., nondimensional infinite dilution excess partial molar free energies, $\ln \gamma_1^\infty$ and $\ln \gamma_2^\infty$) at 40° C. are calculated and shown in Table 3. FIG. 24 shows the relationship between the values of a carbon number $N_{c1}$ of alkanol and A for the of n-alkanol (1)+water (2) at 40° C. FIG. 25 shows the relationship between the values of a carbon number $N_{c1}$ of alkanol and B for the system of n-alkanol (1)+water (2) at 40° C. In FIG. 24, when the point of methanol is extended to that of 1-propanol through that of ethanol, the relationship $(N_{c1}, A)=(3, 2.381)$ is obtained. This value is close to the value of n-propanol which is shown in Table 3 (A=2.281). Likewise, the relationship B=1.37 is obtained as B of n-propanol and is close to $(N_{c1}, B)=(3, 1.234)$ in Table 3. This reveals that the linear sum rule can be applied effectively to the atomic group contribution method.

On the other hand, the filled circle (●) in FIGS. 24 and 25 indicates that the linearity for the system of n-alkanol (1)+water (2) holds only in $N_{c1} \leq 3$. The values of A and B for 2-alkanol are indicated by symbol (x) in FIGS. 24 and 25. These figures show that the values of A and B for n-alkanol and 2-alkanol are different. Conventional group contribution methods cannot identify the difference in binding sites of groups in a molecule, whereas FIGS. 24 and 25 show that the present invention can identify the difference in binding sites.

In FIGS. 24 and 25, the filled inverted triangle (▼) denotes the values of A and B for the system of 1,2-propanediol (1)+water (2) and the filled triangle (▲) denotes the values for the system of ethanolamine (1)+water (2). FIGS. 24 and 25 show that those values are significantly different from those for the system of n-alkanol (1)+water (2).

In conventional group contribution methods, the contribution of diol is incorporated by the doubling of the contribution of —OH groups. The value of A for the system of 1,2-propanediol (1)+water (2) is determined as follows according to a conventional method: first, in FIG. 24, a straight line is drawn from the point of ethanol to that of methanol to determine the Y-intercept (A=−0.22). This value represents the value of A in $N_{c1}=0$, i.e., $\ln \gamma_{OH/H2O}^\infty$, and the contribution of OH groups in water. The value is close to zero and this reflects that the characteristics of OH groups and water are similar to each other. The value of A for 1,2-propanediol is A=2.281+(−0.22)=2.061, assuming that the —H group of n-propanol has been replaced by an —OH group.

However, as shown in Table 3, the actual value of A is A=0.096, indicating that the value of $\ln \gamma_1^\infty$ becomes closer to zero due to hydrophilicity enhanced by the binding of two OH groups to adjacent carbon atoms. When each —OH group is replaced by an —$NH_2$ group, the synergism effect obtained by this group is further increased as indicated by the value of ethanolamine in Table 3 (A=−0.891). This synergism effect changes in intensity when a solvent other than water is used. Thus, FIGS. 24 and 25 show that assigning common synergism effects among groups, regardless of solvents and systems, as in conventional methods, is one cause of the significant reduction of the accuracy in prediction of excess partial molar free energies, i.e., a vapor-liquid equilibrium relationship.

The atomic group contribution method according to the present invention is characterized by the reliability obtained by the determination of the values of nondimensional infinite dilution excess partial molar free energies (A and B) from a highly accurate correlation line and the exclusion of measurement errors therefrom. Specifically, to determine the value of A for the system of 1,2-diol (1)+water (2), the line indicating the relationship between A and $N_{c1}$ for n-alkanol (i.e., the relationship indicated by a solid polygonal line) is parallelly shifted downward to that for 1,2-propanediol to determine the $N_{c1}$ dependency of A on the basis of the already known value of the system of 1,2-propanediol (1)+water (2). By this procedure, the synergism effect of diol can be properly incorporated. Likewise, to determine the value of A for the system of alkanolamine (1)+water (2), the line indicating the relationship between A and $N_{c1}$ for n-alkanol is parallelly shifted downward to that for ethanolamine to determine the relationship between A and $N_{c1}$. Also, the synergism effect can be incorporated by parallel shifting of the line indicating the relationship between B and $N_{c1}$ for n-alkanol in the same manner as above. Since there are abundant reports on vapor-liquid equilibrium measurement values for n-alkanol which are obtained using solvents other than water, the respective relationships between A or B and $N_{c1}$ can be easily determined. Thus, compared with existing methods using all existing vapor-liquid equilibrium measurement values to determine group contribution on a large scale, the present atomic group contribution method is characterized in that it can determine group contribution individually and easily. Users of the atomic group contribution method specify binary systems and temperature or pressure to prepare the relationship indicated by the solid line in FIGS. 24 and 25, i.e., the relationship between A or B and the carbon number $N_{c1}$ of alkane for homologous series including the groups at the end of the alkane. Next, the relationship between A or B and a carbon number $N_{c1}$ (reference relationship) for a binary system including synergism effect is determined from measurement values. Finally, the line indicating the carbon number dependency of the already determined values of A and B is parallelly shifted to the reference value to determine the values of A and B for the binary system. As shown by FIGS. 24 and 25, abundant measurement values of the system of 2-alkanol (1)+water (2) are found and thus the measurement values are preferably used without parallel shifting. Also, an interpolation or extrapolation method may be used for carbon number data that is missing.

[Simple Application of Atomic Group Contribution Method]

The atomic group contribution method can also be simply applied. FIGS. 24 and 25 show one example of the application. The relationship between nondimensional infinite dilution excess partial molar free energies (A and B) and a carbon number $N_{c1}$ may be approximated by a straight broken line. In this case, straight-line approximation is possible taking advantage of data abundance. A straight line (broken line) has been determined from two points for methanol and ethanol for the system of n-alkanol (1)+water (2) which is shown in FIGS. 24 and 25. Further, as shown by the dotted line in FIG. 24 or 25, the broken line may be parallelly shifted and the relationship for 1,2-diol or alkanolamine in which synergism effect is expected may be approximated by a straight line including the point for the component. Alternatively, in a simple method, an average value may be used as the slope of straight-line approximation or the slope may be made approximate to zero.

TABLE 3

Values of A and B determined from carbon number $N_{c1}$ and highly accurate correlation according to the present invention for the system of n-alkanol (1) + water (2), the system of 2-alkanol (1) + water (2), the system of 1,2-propanediol (1) + water (2) and the system of ethanolamine (1) + water (2) at 40° C.

| Carbon number $N_{c1}$ | A | B | Number of data sets | A | B | Number of data sets |
|---|---|---|---|---|---|---|
| | n-Alkanol | | | 2-Alkanol | | |
| 1 | 0.649 | 0.412 | 60 | 0.649 | 0.412 | 60 |
| 2 | 1.515 | 0.891 | 104 | 1.515 | 0.891 | 104 |
| 3 | 2.281 | 1.234 | 31 | 2.129 | 1.085 | 42 |
| 4 | 3.454 | 1.038 | 25 | 3.066 | 0.641 | 13 |
| 5 | | | | 3.043 | 1.42 | 3 |
| 6 | 3.13 | 1.936 | 6 | 3.204 | 1.656 | 1 |
| | 1,2-Propanediol | | | Ethanolamine | | |
| 3 | 0.096 | −0.246 | 13 | −0.891 | −0.907 | 5 |

The invention claimed is:

1. A method for controlling a separator or a refiner, comprising:
   recording existing binary phase equilibrium data;
   implementing a computer-based method for predicting binary phase equilibrium data comprising:
      by using binary phase equilibrium measurement data, calculating an index X of proximity ratio to critical points according to $$X = \frac{p_{1s} + p_{2s}}{P_{c1} + p_{2s}},$$

and calculating infinite dilution pressure gradients $Y_1$ and $Y_2$ according to:

$$Y_1 = \frac{\gamma_1^\infty p_{1s} - p_{2s}}{P_{c1} - p_{2s}} \text{ and } Y_2 = \frac{p_{1s} - \gamma_2^\infty p_{2s}}{P_{c1} - p_{2s}},$$

wherein $P_{c1}$ represents a critical pressure of a lighter component in a binary system, $p_{1s}$ and $p_{2s}$ represent vapor pressures of components 1 and 2, respectively, at a temperature T, and $\gamma_i^\infty$ and $\gamma_2^\infty$ represent infinite dilution activity coefficients of components 1 and 2 in a liquid phase, respectively;

correlating the obtained index X of proximity ratio to critical points with the infinite dilution pressure gradients $Y_1$ and $Y_2$ and calculating infinite dilution activity coefficients $\gamma_1^\infty$ and $\gamma_2^\infty$ or binary parameters A and B from the X-$Y_1$ correlation and the X-$Y_2$ correlation, respectively, the binary parameters A and B being given by A=ln $\gamma_1^\infty$ and B=ln $\gamma_2^\infty$; and evaluating thermodynamic consistency of the X-$Y_1$ and X-$Y_2$ correlation data according to $$H = \left| \frac{\beta_{exp} - \beta_{cal}}{\beta_{cal}} \right|$$

using values of $\beta_{exp}$ and $\beta_{cal}$ obtained by incorporating values of binary parameters A and B into the following equation $$\beta = \frac{F}{|B - A|}$$

to determine the correlations by confirming that data that satisfy the thermodynamic consistency within a predetermined error range is highly reliable data, and correlating X with $Y_1$ and $Y_2$ using only thermodynamically consistent data, wherein
   $\beta_{exp}$ represents a value of $\beta$ that is calculated according to F/|B−A| using F, A, and B determined from actually measured values;
   $\beta_{cal}$ represents a value of $\beta$ that is calculated from $$\frac{F}{|B - A|} = aP^b$$

using values of a and b obtained by correlation of actually measured values:
   A and B represent binary parameters;
   F represents deviation from A=B in a one-parameter Margules equation;
   P represents a pressure or an average vapor pressure;
   a and b represent constants specific for a binary system; and
   predicting new binary phase equilibrium data using the calculated values of the infinite dilution activity coefficients $\gamma_1^\infty$ and $\gamma_2^\infty$ or binary parameters A and B; and
controlling the separator or the refiner according to the predicted new binary phase equilibrium data.

2. The method according to claim 1, wherein
the new binary phase equilibrium data which is predicted using the calculated values of the infinite dilution activity coefficients $\gamma_1^\infty$ and $\gamma_2^\infty$ or the binary parameters A and B make data of a plurality of systems of a homologous series, and
based on the data of a plurality of systems of homologous series, new infinite dilution activity coefficients $\gamma_1^\infty$ and $\gamma_2^\infty$ or binary parameters A and B in other systems of the homologous series are predicted.

3. The method according to claim 1, further comprising:
calculating infinite dilution activity coefficients or binary parameters for atomic groups from the calculated infinite dilution activity coefficients $\gamma_1^\infty$ and $\gamma_2^\infty$ or binary parameters A and B; and
predicting new binary phase equilibrium data based on the calculated infinite dilution activity coefficients or binary parameters for atomic groups.

4. The method according to claim 1, wherein the separator or refiner is a distillation column, an extraction column, or a crystallizer.

* * * * *

UNITED STATES PATENT AND TRADEMARK OFFICE
CERTIFICATE OF CORRECTION

PATENT NO. : 9,852,241 B2
APPLICATION NO. : 14/348439
DATED : December 26, 2017
INVENTOR(S) : Satoru Kato It is certified that error appears in the above-identified patent and that said Letters Patent is hereby corrected as shown below:

In the Claims

Column 43, Line 53:
In Claim 1, delete "$Y_i^\infty$" and insert -- $Y_1^\infty$ --, therefore.

Signed and Sealed this
Twenty-ninth Day of May, 2018

Andrei Iancu
*Director of the United States Patent and Trademark Office*